(12) United States Patent
Kamikawa et al.

(10) Patent No.: US 7,337,792 B2
(45) Date of Patent: Mar. 4, 2008

(54) LIQUID PROCESSING APPARATUS AND LIQUID PROCESSING METHOD

(75) Inventors: Yuji Kamikawa, Tosu (JP); Shori Mukuo, Tosu (JP)

(73) Assignee: Tokyo Electron Limited, Tokyo-to (JP)

( * ) Notice: Subject to any disclaimer, the term of this patent is extended or adjusted under 35 U.S.C. 154(b) by 543 days.

(21) Appl. No.: 10/377,492

(22) Filed: Feb. 28, 2003

(65) Prior Publication Data

US 2003/0164179 A1 Sep. 4, 2003

(30) Foreign Application Priority Data

Mar. 1, 2002 (JP) ............................. 2002-056510

(51) Int. Cl.
*B08B 3/02* (2006.01)
(52) U.S. Cl. ..................... 134/148; 134/153; 134/902
(58) Field of Classification Search ............... 134/148, 134/153, 902, 66; 135/148, 153, 902, 66
See application file for complete search history.

(56) References Cited

U.S. PATENT DOCUMENTS

| | | | |
|---|---|---|---|
| 3,428,059 A * | 2/1969 | Friedman et al. ........... 134/140 |
| 3,823,836 A * | 7/1974 | Cheney et al. ......... 414/331.18 |
| 3,949,891 A * | 4/1976 | Butler et al. ................ 414/405 |
| 3,964,957 A * | 6/1976 | Walsh ..................... 156/345.23 |
| 4,244,673 A * | 1/1981 | Henderson ................. 414/405 |
| 4,458,703 A * | 7/1984 | Inoue et al. ............... 134/57 R |
| 4,573,851 A * | 3/1986 | Butler ........................ 414/404 |
| 4,597,819 A * | 7/1986 | Kusuhara et al. ...... 156/345.54 |
| 5,007,788 A * | 4/1991 | Asano et al. .......... 414/416.09 |
| 5,125,784 A * | 6/1992 | Asano ......................... 414/404 |
| 5,370,142 A * | 12/1994 | Nishi et al. .................... 134/61 |
| 5,374,153 A * | 12/1994 | Nishi ..................... 414/416.11 |
| 5,603,777 A * | 2/1997 | Ohashi ....................... 134/25.4 |
| 5,664,927 A * | 9/1997 | Takeuchi ............... 414/225.01 |
| 5,730,162 A * | 3/1998 | Shindo et al. ................ 134/66 |
| 5,862,823 A * | 1/1999 | Kamikawa et al. ......... 134/182 |
| 5,951,763 A * | 9/1999 | Knox .......................... 118/409 |
| 5,976,198 A * | 11/1999 | Suhara et al. ............... 29/25.01 |
| 6,138,695 A * | 10/2000 | Shibao et al. ................. 134/61 |

(Continued)

FOREIGN PATENT DOCUMENTS

JP          1-171237       *  7/1989

(Continued)

*Primary Examiner*—Frankie L. Stinson
(74) *Attorney, Agent, or Firm*—Morrison & Foerster LLP

(57) ABSTRACT

A cleaning apparatus 1 includes a foup loading/unloading part 2 for mounting foups F each accommodating a plurality of wafers W at intervals of a constant pitch (normal pitch), a rotor 34 capable of holding the wafers W at half the normal pitch (half pitch), a wafer transporting device 11 for transporting the wafer E between the foup F and the rotor 34, wafer posture changing devices 20a, 20b, a wafer elevating mechanism 40, a motor 31 for rotating the rotor 34, an outer chamber 71a and an inner chamber 71b both accommodating the rotor 34, and cleaning liquid nozzles 53, 55 for supplying a cleaning liquid to the wafers W. The rotor 34 holds the wafers W at intervals of an optional pitch (every one holding pitch or every plural holding pitches) to carry out a cleaning operation. Consequently, it is possible to process substrates accommodated in two containers at one batch processing.

9 Claims, 15 Drawing Sheets

U.S. PATENT DOCUMENTS

| | | | |
|---|---|---|---|
| 6,177,129 B1 * | 1/2001 | Wagner et al. | 427/8 |
| 6,187,060 B1 * | 2/2001 | Nishida et al. | 29/25.01 |
| 6,193,459 B1 * | 2/2001 | Rush | 104/35 |
| 6,279,724 B1 * | 8/2001 | Davis | 198/465.2 |
| 6,427,850 B2 * | 8/2002 | Mendiola | 211/41.18 |
| 6,532,975 B1 | 3/2003 | Kamikawa et al. | |
| 6,543,982 B1 * | 4/2003 | Nichols et al. | 414/331.16 |
| 6,776,173 B2 | 8/2004 | Kamikawa | |
| 2001/0048867 A1 * | 12/2001 | Lebar et al. | 414/217 |
| 2002/0000240 A1 | 1/2002 | Kamikawa | |

FOREIGN PATENT DOCUMENTS

JP  7-2308  *  1/1995

* cited by examiner

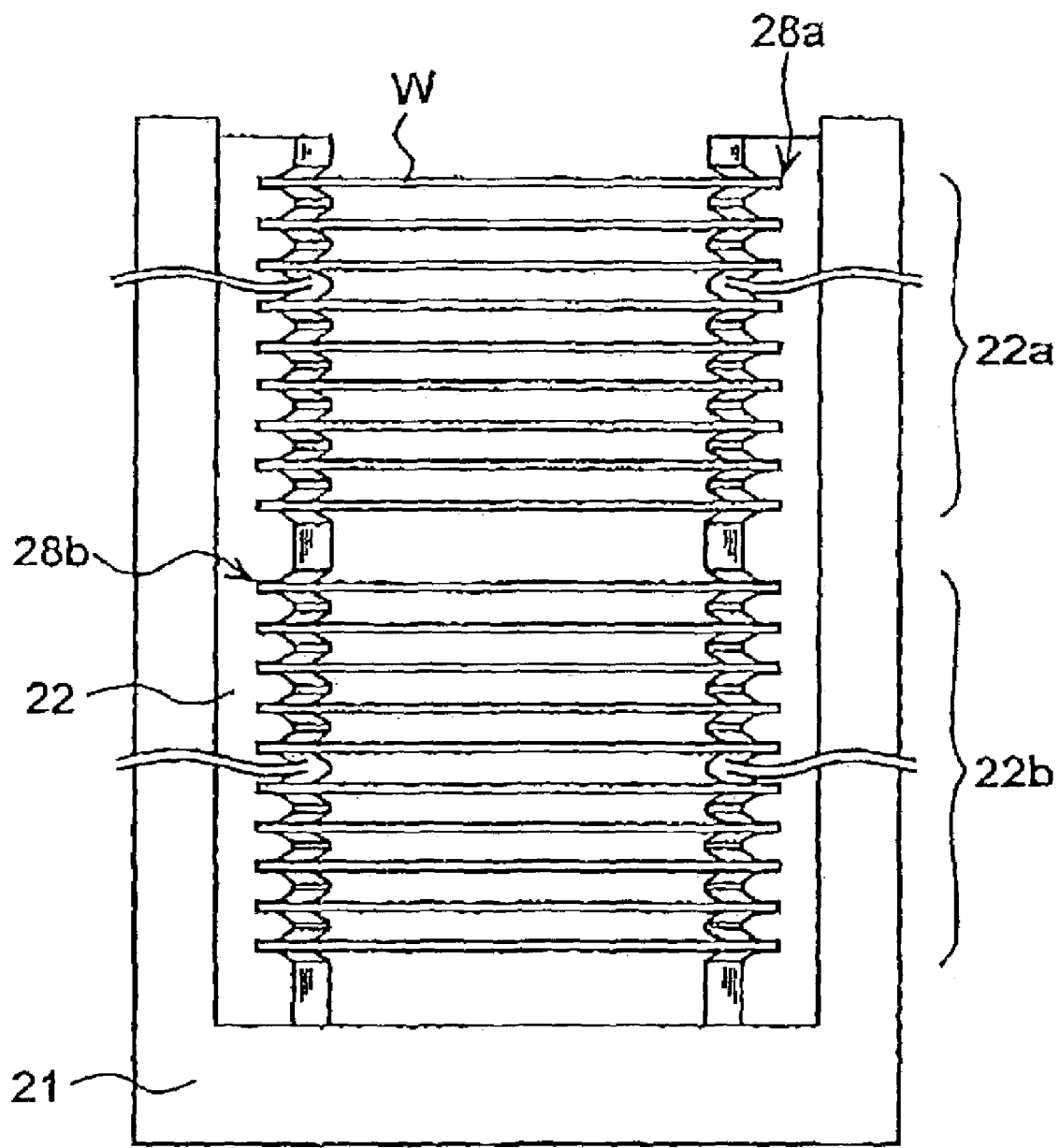
F I G. 4

LIQUID PROCESSING APPARATUS AND LIQUID PROCESSING METHOD

BACKGROUND OF THE INVENTION

1. Technical Field of the Invention

This invention relates to liquid processing apparatus and method for applying a designated liquid processing on a variety of substrates, such as semiconductor wafer and LCD substrate.

2. Description of the Related Art

In general, the manufacturing process of semiconductor devices employs a wafer liquid processing apparatus that processes semiconductor wafers (called as "wafer" hereinafter) as the substrates with processing liquids, such as specified chemical and deionized water (pure water), in order to remove particles, organic contamination, contamination such as metallic impurities, organic matter, oxide film, etc. from the wafers.

As the wafer liquid processing apparatus, for example, there is known a batch type processing apparatus that accommodates a number of wafers in a liquid processing chamber and processes the wafers in batch. In this apparatus, it is generally carried out to process the wafers in increments of carriers (wafer containers). Since the carrier is formed) to accommodate a predetermined number of substantially-parallel wafers, for example, twenty-five parallel wafers at regular intervals, the liquid processing of the wafers is carried out as the following steps of: first picking up these wafers from the carrier at a time; next transporting the wafers to a rotor; and subsequently supplying a processing liquid to the wafers while rotating the rotor. Noted that an interval (pitch) of the wafers in the rotor is equal to the interval of the wafers in the carrier.

In the conventional liquid processing method mentioned above, however, it is difficult to increase the throughput capacity of the apparatus because the number of wafers to be processed in one batch processing is no more than the number of wafers accommodated in one carrier. In this view, for example, it is expected to make one rotor retain the wafers of two carriers for one batch processing. In this case, if the wafers of two carriers are once accommodated in one rotor at the same pitch as the pitch of the wafers in one carrier, there crops up various problems: jumboized rotor, jumboized chamber to accommodate the rotor, increased consumption of processing liquid in relation to the jumboized chamber, etc.

In the conventional liquid processing apparatus where wafers are dipped in the processing liquid stored in a tank etc. without rotating the wafers, there is known a liquid processing apparatus that applies the liquid processing on the wafers carried half of the pitch of wafers in the carrier. To the contrary, as for the liquid processing while rotating the wafers, it has not been carried out to apply the liquid processing on the wafers carried half of the pitch of wafers in the carrier.

Further, when processing the wafers accommodated in two carriers in one batch processing, it is hard to increase the total throughput (including the transportation of the carriers) in spite of improvement in the throughput of the liquid processing unless the transportation of the carriers accommodating the wafers is executed effectively.

Additionally, since the wafers are discharged from the carrier at a time and successively loaded on the rotor in the conventional liquid processing method, the pitch of the wafers carried on the rotor is always constant. Thus, it is impossible to perform the liquid processing while allowing the rotor to carry the wafers in optional pitch. Moreover, since the wafers have been processed in units of carrier in accordance with the conventional liquid processing method, it is impossible to pick up an optional carrier from plural carriers for one batch processing.

SUMMARY OF THE INVENTION

Under such a circumference as mentioned above, an object of the present invention is to provide a rotary liquid processing apparatus which is capable of processing the substrates of two containers in one batch processing and a liquid processing method related to the apparatus. Again, an object of the present invention is to provide liquid processing apparatus and method that can enhance the throughput capacity of the liquid processing. Further, an object of the present invention is to provide liquid processing apparatus and method that can apply the liquid processing on the substrates while carrying them at intervals of an optional pitch. Still further, an object of the present invention is to provide liquid processing apparatus and method that allow the substrates for one batch processing to be optionally composed by extracting designated substrates from a plurality of containers.

In order to attain the above object to be solved, a liquid processing apparatus which supplies a plurality of substrates with a processing liquid while rotating the substrates to perform a liquid processing, comprises: a container mounting part for mounting a container where a plurality of substrates are accommodated at intervals of a constant pitch; substrate holder capable of holding the plural substrates in substantially parallel with each other at intervals of a pitch smaller than the constant pitch at the container; substrate transporter for transporting the substrates between the container mounted on the container mounting part and the substrate holder; rotor for rotating the substrate holder; a chamber formed so as to be able to accommodate the substrate holder therein; and processing-liquid supplyer for supplying the substrates accommodated in the chamber with a processing liquid, wherein the liquid processing is performed under condition that the substrates are held by the substrate holder at intervals of an optional pitch.

The substrate transporter includes a first substrate transporting device that transfers the substrates one by one to and from the container mounted on the container mounting part, in their substantially-horizontal postures and that transports the substrates one by one in their substantially-horizontal postures.

The liquid processing apparatus further comprises substrate-posture changer that can hold the substrates of two containers at a time, in substantially parallel with each other and at intervals of a pitch smaller than the constant pitch at the container and that can change the postures of the substrates between their substantially-horizontal postures and their substantially-vertical postures, wherein the substrate transporter comprises: a first substrate transporting device that transfers the substrates one by one to and from the substrate-posture changer and the container mounted on the container mounting part, in a substantially-horizontal posture and that transports the substrates one by one between the container and the substrate-posture changer, in a substantially-horizontal posture; and a second substrate transporting device that transfers the substrates between the substrate-posture changer and the substrate holder, in their substantially-vertical postures, wherein the substrate holder can hold the plural substrates while maintaining the substrates being held in their substantially-vertical postures by the substrate-posture changer.

The first substrate transporting device includes: an unprocessed-wafer transporting pick that picks up an unprocessed substrate from the container mounted on the container mounting part and successively delivers the substrate to the substrate-posture changer; and a processed-wafer transporting pick that receives a processed substrate from the substrate-posture changer and successively puts the substrate back in a designated position of the container mounted on the container mounting part.

The substrate-posture changer comprises: an unprocessed-wafer hold change mechanism including a first substrate holding arm having retention grooves formed at intervals of a pitch smaller than the constant pitch at the container to hold the substrates before the liquid processing, and a first arm rotating mechanism which rotates the first substrate holding arm so that the postures of the substrates held by the first substrate holding arm can be changed between their substantially-horizontal postures and their substantially-vertical postures; and a processed-wafer hold change mechanism including a second substrate holding arm having retention grooves formed at intervals of a pitch smaller than the constant pitch at the container to hold the substrates after the liquid processing, and a second arm rotating mechanism which rotates the second substrate holding arm so that the postures of the substrates held by the second substrate holding arm can be changed between their substantially-horizontal postures and their substantially-vertical postures.

The unprocessed-wafer hold change mechanism further includes a first arm moving mechanism for moving the first substrate holding arm between one position to transfer the substrates from the first substrate holding arm to the first substrate transporting device, and vice versa and another position to transfer the substrates from the first substrate holding arm to the second substrate transporting device, and vice versa, and the processed-wafer hold change mechanism further includes a second arm moving mechanism for moving the second substrate holding arm between one position to transfer the substrates from the second substrate holding arm to the first substrate transporting device, and vice versa and another position to transfer the substrates from the second substrate holding arm to the second substrate transporting device, and vice versa.

The first substrate holding arm and the second substrate holding arm each includes a first group of retention grooves formed at intervals of a pitch smaller than the constant pitch at the container, the number of the retention grooves being equal to the number of substrates that the single container can accommodate; and a second group of retention grooves formed at intervals of a pitch smaller than the constant pitch at the container, the number of the retention grooves being equal to the number of substrates that the single container can accommodate, wherein a pitch between the first group of retention grooves and the second group of retention grooves is equal to the constant pitch at the container.

The first substrate holding arm and the second substrate holding arm each includes a guide for restraining movements of the substrates so that they do not protrude horizontally when changing the postures of substrates from their substantially-vertical postures to their substantially-horizontal postures.

The second substrate transporting device includes a third substrate holding arm having an unprocessed-substrate gripping part that receives the unprocessed substrates from the first substrate holding arm and successively delivers the substrates to the substrate holder and a processed-substrate gripping part that receives the processed substrates from the substrate holder first substrate holding arm and successively delivers the substrates to the second substrate holding arm.

The liquid processing apparatus further comprises: a transportation control device that controls the operation of the first substrate transporting device in a manner that the first substrate transporting device picks up the substrates in designated number from the plural containers mounted on the container mounting part; subsequently delivers the substrates to the substrate-posture changer thereby forming one batch of substrates; and further returns each substrate after the liquid processing to an original slot in an original container where the substrate was, whereby the composition of the substrates supplied for one batch of liquid processing can be altered optionally.

A liquid processing apparatus which supplies a plurality of substrates with a processing liquid to perform a liquid processing in a batch manner, comprises: a container mounting part for mounting a container where a plurality of substrates are accommodated at intervals of a constant pitch; substrate holder capable of holding the plural substrates in substantially parallel with each other; substrate transporter for transporting the substrates between the container mounted on the container mounting part and the substrate holder; a chamber capable of accommodating the substrate holder therein;

processing-liquid supplyer for supplying the substrates accommodated in the chamber with a processing liquid; and a transportation control device that controls the operation of the substrate transporter in a manner that the substrate transporter picks up the substrates in designated number from the plural containers mounted on the container mounting part; subsequently delivers the substrates to the substrate holder thereby forming one batch of substrates; and further returns each substrate after the liquid processing to an original slot in an original container where the substrate was, whereby the composition of the substrates supplied for one batch of liquid processing can be changed optionally.

The substrate holder is capable of holding the plural substrates in parallel with each other at intervals of a pitch smaller than the constant pitch at the container.

The liquid processing apparatus further comprises rotor for rotating the substrate holder, wherein the substrates held by the substrate holder are supplied with a designated processing liquid by the processing-liquid supplyer while the rotor rotates the substrate holder.

The substrate transporter includes a first substrate transporting device that transfers the substrates one by one to and from the container mounted on the container mounting part, in their substantially-horizontal postures and that transports the substrates one by one in their substantially-horizontal postures.

The chamber includes an outer chamber which is in the form of a substantial cylinder capable of accommodating the substrate holder therein, the outer chamber having a window formed on one end face thereof to allow the substrate holder to enter and withdraw from the outer chamber, and an inner chamber which is slidable outside and inside the outer chamber and which is in the form of a substantial cylinder capable of accommodating the substrate holder while the inner cylinder is accommodated in the outer cylinder; the inner chamber can enter and withdraw from the outer chamber through another end face thereof that does not include the window; and the liquid processing apparatus further comprises a holder moving mechanism for allowing the substrate holder to enter and withdraw from the outer chamber and a lid for closing the window when the substrate holder is accommodated in the outer chamber.

The pitch of the substrates held by the substrate holder is half the constant pitch of the substrates at the container.

A liquid processing method of supplying a plurality of substrates with a processing liquid while rotating the substrates thereby performing a liquid processing in batches, comprises the steps of: carrying the substrates one by one out of a container where the plural substrates are accommodated at intervals of a constant pitch and allowing substrate holder to hold the substrates at intervals of an optional pitch, the substrate holder being capable of holding the substrates at intervals of a pitch smaller than a pitch of the substrates held by the container; accommodating the substrate holder holding a designated number of substrates, in a chamber; and supplying the substrates with the processing liquid while rotating the substrates accommodated in the chamber thereby performing the liquid processing.

A liquid processing method of supplying a plurality of substrates with a processing liquid thereby performing a liquid processing in batches, comprising the steps of: picking up the substrates in designated number from a plurality of containers and allowing substrate holder capable of holding the substrates at intervals of a designated pitch to hold the substrates thereby forming one batch of substrates; accommodating the substrate holder holding the substrates, in a chamber; supplying the substrates accommodated in the chamber with the processing thereby performing the liquid processing; and returning each substrate after the liquid processing to an original slot in an original container where the substrate was, whereby the liquid processing for the substrates is carried out upon changing the composition of the substrates supplied for one batch of liquid processing optionally In the liquid processing method, the designated pitch of the substrates held by the substrate holder is smaller than a pitch of the substrates at the container.

The step of supplying the substrates with the processing liquid to perform the liquid processing is carried out while rotating the substrates.

A liquid processing method of supplying a plurality of substrates with a processing liquid while rotating the substrates thereby performing a liquid processing in batches, comprises the steps of: carrying the substrates one by one out of a first container where the plural substrates are accommodated in their substantially-horizontal postures at regular intervals vertically and allowing a first substrate holding part to hold a designated number of substrates in substantially parallel with each other at intervals of a constant pitch vertically and thereafter, carrying the substrates one by one out of a second container where the plural substrates are accommodated in their substantially-horizontal postures at regular intervals vertically and allowing a second substrate holding part to hold a designated number of substrates in substantially parallel with each other at intervals of a constant pitch vertically; changing the postures of the substrates held by the first substrate holding part and the second substrate holding part to their substantially-vertical postures; moving the substrates in their substantially-vertical postures, which are held by the first substrate holding part and the second substrate holding part, to substrate holder; accommodating the substrate holder holding the substrates, in a chamber and supplying the substrates with the processing liquid while rotating the substrate holder thereby performing the liquid processing; transporting the substrates after the liquid processing to the first substrate holding part and the second substrate holding part; changing the postures of the substrates held by the first substrate holding part and the second substrate holding part to their substantially-horizontal postures; and returning the substrates held by the first substrate holding part to the first container and thereafter, returning the substrates held by the second substrate holding part to the second container.

A pitch the substrates held by the first substrate holding part and the second substrate holding part is half the pitch of the substrates accommodated in the first container and the second container.

The first substrate holding part is positioned upside of the second substrate holding part in a condition that the first substrate holding part and the second substrate holding part can hold the substrates in their substantially-horizontal postures;

the width of a gap between the first substrate holding part and the second substrate holding part is equal to the pitch of the substrates accommodated in the first container and the second container so that a transporting pick having access to the first container and the second container can enter the gap between the first substrate holding part and the second substrate holding part; the transporting pick carries the substrates in the first substrate holding part only from its upside downward successively, and inversely carries the substrates out of the first substrate holding part only from its downside upward successively; and the transporting pick carries the substrates in the second substrate holding part only from its upside downward successively, and inversely carries the substrates out of the second substrate holding part only from its downside upward successively.

According to the liquid processing apparatus and method mentioned above, it is possible to enhance the throughput of the apparatus since the substrates accommodated in two containers can be processed in one batch processing. At liquid processing, since the substrates are held by the substrate holder at intervals of the pitch smaller than the constant pitch at the container, the substrate holding means etc. can be prevented from jumboizing. Additionally, it is also possible to perform the liquid processing while allowing the substrate holder to hold a plurality of substrates at intervals of an optional pitch. Therefore, against a situation that the processing liquid is hard to enter between the adjoining substrates because of its high viscosity, it is possible to cope with the above problem by increasing the pitch to hold the substrates. Furthermore, the composition of the substrates to be processed in one batch processing can be optionally altered by extracting prescribed ones of the substrates in the plural containers. Consequently, if there are some substrates, which have to be processed with a specified processing liquid, over a plurality of containers, it becomes possible to extract only the relevant substrates from the containers and further possible to process the so-extracted substrates with the specified processing liquid in one try.

BRIEF DESCRIPTION OF THE DRAWINGS

FIG. 4 is a side view showing the structure of a wafer holding arm provided in the wafer posture changing device;

DESCRIPTION OF THE PREFERRED EMBODIMENT

With reference to attached drawings, embodiments of the present invention will be described below, in detail. Here, the present invention is applied to a cleaning apparatus that is constructed so as to consistently perform transportation of semiconductor wafers (wafers), cleaning of the wafers and drying of the wafers in a batch manner.

Figure 1:
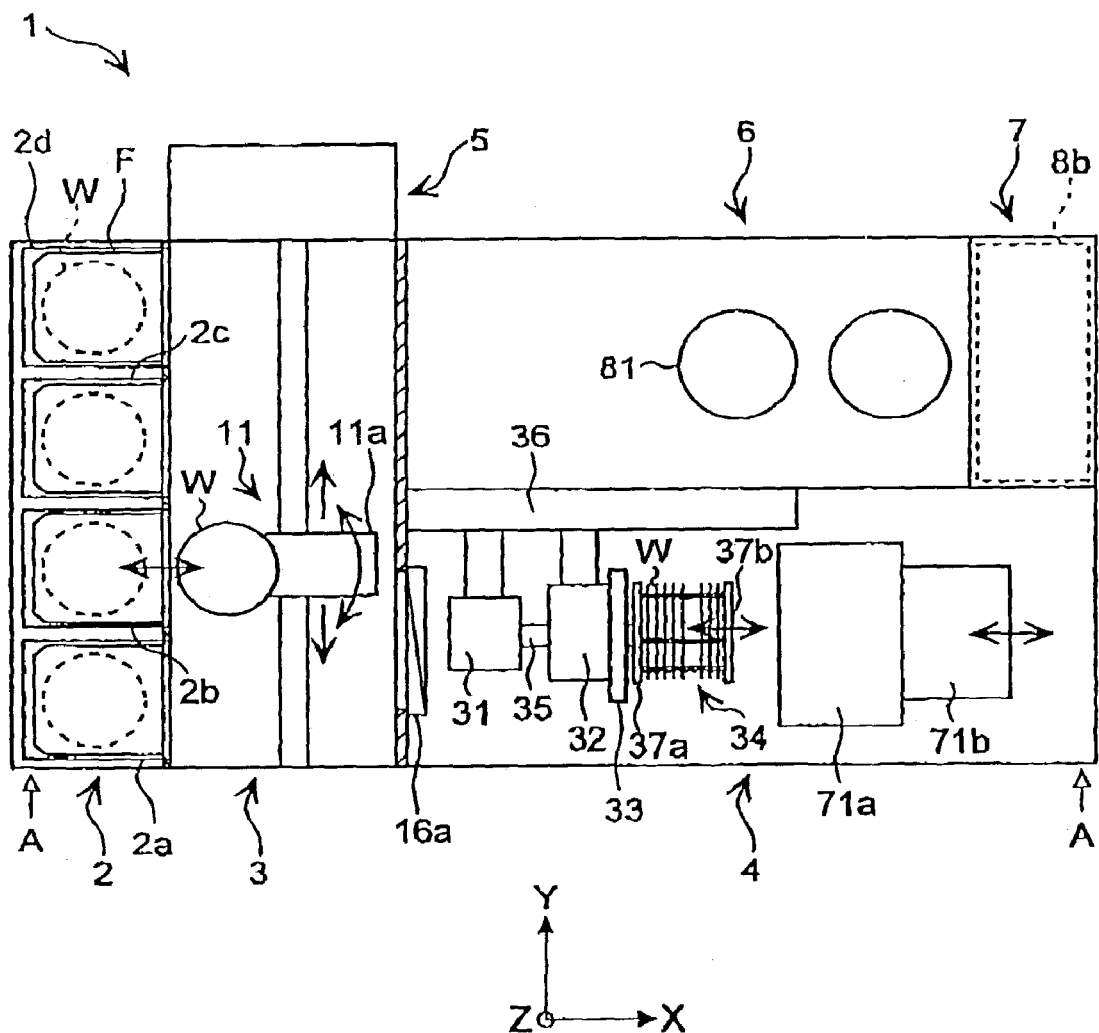
FIG. 1 is a plan view showing the schematic structure of a cleaning apparatus in accordance with the present invention.
Figure 2:
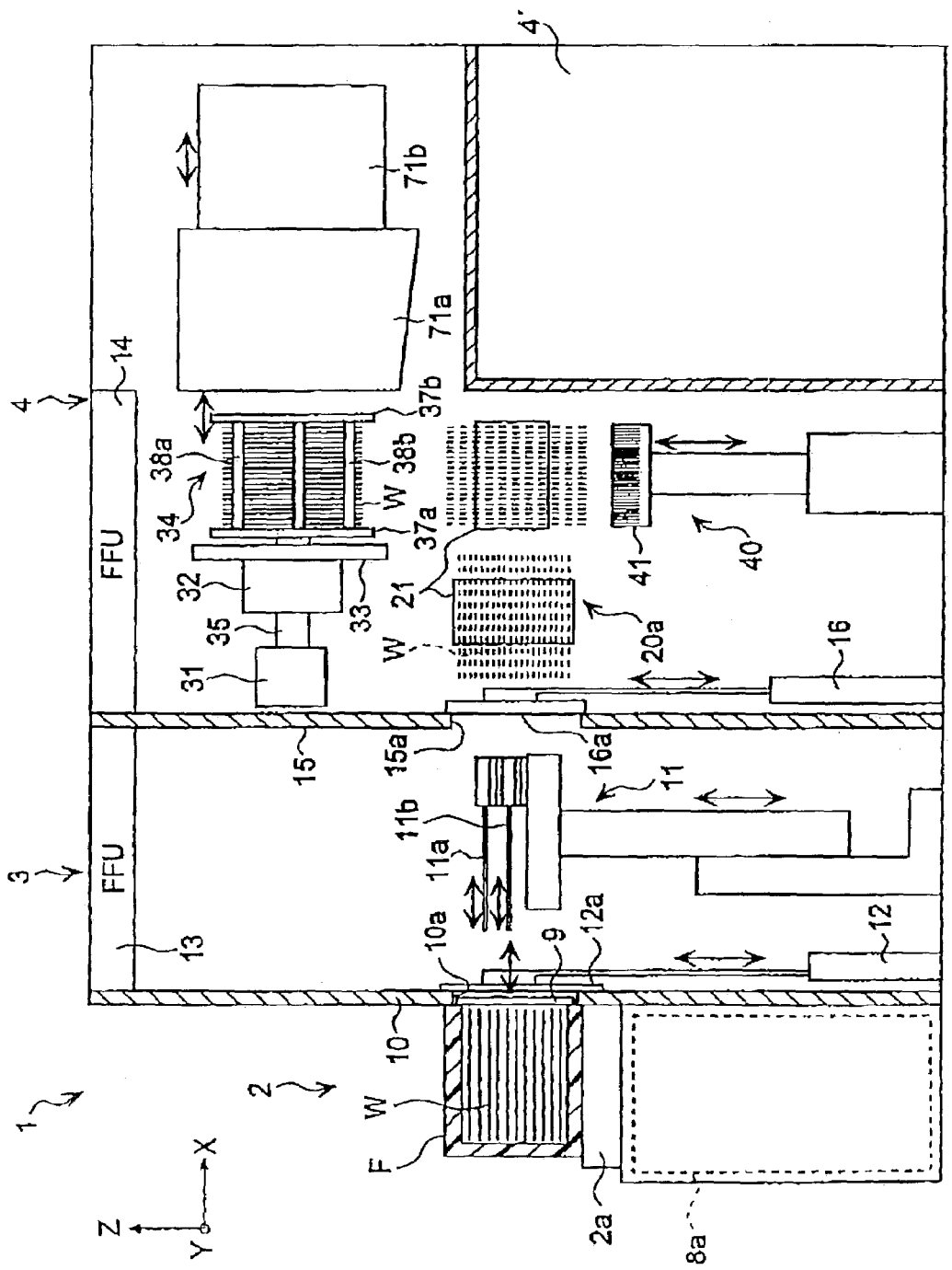
FIG. 2 is a side view showing the schematic structure of the cleaning apparatus of FIG. 1.

FIG. 1 is a plan view showing the schematic structure of a cleaning apparatus 1. FIG. 2 is a schematic side view of the cleaning apparatus 1, viewed from the direction of arrows AA of FIG. 1. The cleaning apparatus 1 includes a "foup" loading/unloading (carry-in-and-out) part 2 for mounting a foup (carrier) F accommodating wafers W therein, a cleaning unit 4 to apply a cleaning process to the wafers W, a wafer transfer unit 3 for transporting the wafers W between the loading/unloading part 2 and the cleaning unit 4, a power unit 5 for various types of power-drive mechanisms and electronic control devices in the cleaning apparatus 1, a chemical supply unit 6 for storing and supplying chemical liquids (chemicals) for cleaning and a process control unit 7 for controlling the treatment process of the wafers W at the cleaning unit 4.

The foup F is capable of accommodating a plurality of wafers, for example, twenty-five wafers W in their substantially-horizontal postures at regular intervals of an arrangement pitch along the direction Z. Hereinafter, the arrangement pitch of the wafers W in the foup F is called as "normal pitch". For example, the normal pitch is equal to 10 mm. Inside the foup F, there are formed, in order from the bottom, slots #1-#25 each of which accommodates a single wafer W therein. The foup F is provided, on one side thereof, with a wafer loading/unloading port for loading or unloading the wafers W therethrough. The wafer loading/unloading port is closed by a lid body 9. In the foup loading/unloading part 2, four foup stages 2a-2d are juxtaposed in the direction Y of the figure. The foup stages 2a-2d are provided to mount the foups F thereon.

In a boundary wall 10 between the wafer transporting unit 3 and the foup loading/unloading part 2, windows 10a are formed to correspond to the foup stages 2a-2d. Inside the boundary wall 10 (on the side of the wafer transporting unit 3), a shutter 12a for closing the window 10a and a shutter moving mechanism 12 for moving the shutter 12a horizontally (X-direction) and in the Z-direction are provided for each window 10a. The shutter 12a is equipped with a lid-body detachable mechanism (not shown) that carries the lid body 9 and detaches it from the foup F. Closing the windows 10a through the wafer ports, the foups F are mounted on the foup stages 2a-2d.

The wafer transporting unit 3 is provided with a wafer transporting device 11 and a filter fan unit (FFU) 13. The wafer transporting device 11 includes a wafer transporting pick 11a that carries an unprocessed wafer W out of the foup F and delivers the wafer W to a wafer posture changing device 20a mentioned later and a wafer transporting pick 11b that receives a processed wafer W (after the liquid processing) from a wafer-posture changing device 20b also mentioned later and returns the wafer W to a designated position in the foup F.

The wafer transporting device 11 further includes an arm slide mechanism that carries the wafer transporting picks 11a, 11b individually to move them in the direction X, an arm elevating mechanism that carries the wafer transporting picks 11a, 11b individually to move the picks 11a, 11b in the direction Z, an arm rotating mechanism that rotates the picks 11a, 11b in a horizontal plane to make them have access to the foup loading/unloading part 2 or the cleaning unit 4 and an arm moving mechanism that slides the picks 11a, 11b in the direction Y so that they can have access to an optional foup F mounted on the loading/unloading part 2. With this structure of the device 11, the wafer transporting pick 11a can transport a wafer W accommodated in a designated position in the foup F to a designated position of the wafer posture changing device 20a and further carry a wafer W, which has been accommodated in a designated position of the wafer posture changing device 20b, in a designated position in the foup F.

The fan filter unit 13 supplies fresh air into the wafer transporting unit 3 downwardly. With this downward flow of fresh air, it is possible to prevent the particles from adhering to the wafers W held by the picks 11a, 11b. Noted that a not-shown ionizer may be arranged below the unit 13 to remove electrical charges from the wafers W. As for the cleaning unit 4, another filter fan unit 14 supplies fresh air into the unit 4 downwardly in order to prevent the adhesion of particles to the wafer W.

In a boundary wall 15 that separates the wafer transporting unit 3 from the cleaning unit 4, a window 15a is formed to transport the wafer W therethrough. The window 15a can be closed by a shutter 16a. The shutter 16a can be withdrawn from the window 15a by a shutter elevating mechanism 16. In a modification of the shown arrangement, the shutter 16a and the shutter elevating mechanism 16 may be arranged in the wafer transporting unit 3.

The cleaning unit 4 includes the wafer posture changing devices 20a, 20b that can hold the wafers W of two foups F in the maximum number, at intervals of a half pitch of the normal pitch, which will be referred as "half pitch" hereinafter, and that can change the postures of the wafers W between their substantially-horizontal postures and their substantially-vertical postures. Note: FIG. 2 shows only one wafer holding arm 21 provided in the wafer posture changing device 20a. The other wafer posture changing device 20b will be described with reference to FIG. 3 to FIG. 5. The cleaning unit 4 further includes a rotor 34 that can accommodate the wafers W, which have been held in the substantially-vertical postures by the wafer posture changing devices 20a, 20b, as they are, a wafer elevating mechanism 40 for moving the wafers W in their substantially-vertical postures between the devices 20a, 20b and the rotor 34 vertically, an outer chamber 71a and an inner chamber 71b that accommodate the rotor 34 holding the waters W and supply the wafers W with a designated cleaning liquid for cleaning them.

Under the chambers 71a, 71b in the cleaning unit 4, a utility chamber 4' is defined to accommodate a booster pump for the cleaning liquid to be supplied to the chambers 71a, 71b, various pipes for conducting the cleaning liquid etc. discharged from the chambers 71a, 71b to the outside and so on.

Figure 3:
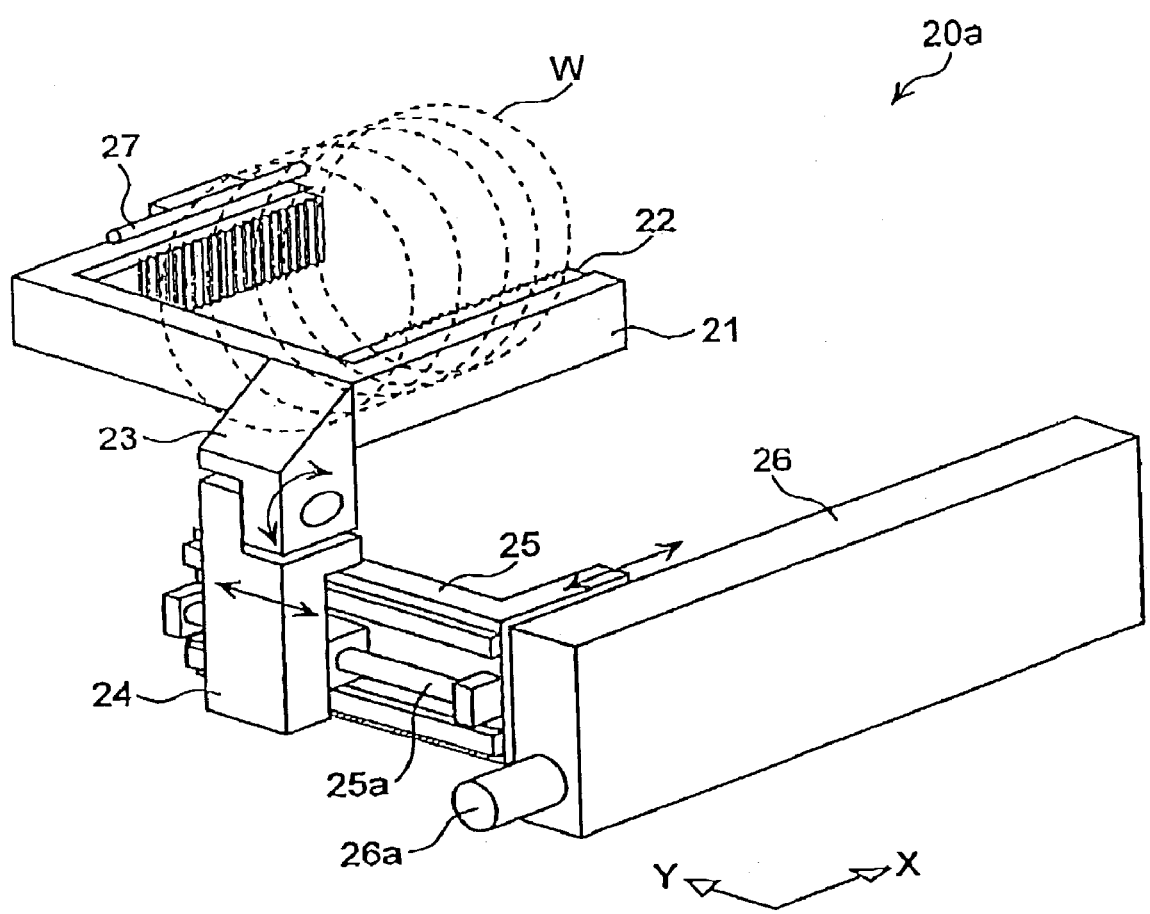
FIG. 3 is a perspective view showing the schematic structure of a wafer posture changing device.

FIG. 3 is a perspective view showing the schematic structure of the wafer posture changing device 20a. FIG. 4 is a side view showing a condition that the wafer holding arm 21 of the wafer posture changing device 20a holds the wafers W in their substantially-horizontal postures. FIGS. 5A, 5B, 5C, 5D, 5E and 5F are explanatory views showing the movements of the wafer posture changing devices 20a, 20b, viewed from the direction Z.

The wafer posture changing device 20a includes the substantially-U shaped wafer holding arm 21 provided with wafer holding members 22 for carrying the wafers W, an arm rotating mechanism 23 for spinning the arm 21 within an angle of 90 degrees, a Y-directional slide member 24 carrying the mechanism 23 and slidable in the direction Y, a Y-directional guide 25 having a ball screw 25a for engagement with the slide member 24 and slidable in the direction X in itself and an X-directional guide 26 having a ball screw 26a for engagement with the Y-directional guide 25. The wafer holding arm 21 has a wafer protrusion-proof member 27 attached thereto to prevent the wafer W from protruding from the members 22 when rotating the arm 21.

As shown in FIG. 4, when holding the wafer holding arm 21 vertically, the wafers W are held in their substantially-horizontal postures by the wafer holding members 22. In this state, the transfer of the wafers W is carried out between the members 22 and the wafer transporting pick 11a. Each of the wafer holding members 22 consists of a first holding part 22a having retention grooves 28a capable of holding twenty-five wafers W of one foup at intervals of the half pitch on the opening side of the arm 21 (i.e. upside of FIG. 4) and a second holding part 22b having retention grooves 28b capable of holding twenty-five wafers W of one foup at intervals of the half pitch on the side of the arm rotating mechanism 23 (i.e. underside of FIG. 4).

In loading the wafers W into the first holding part 22a and the second holding part 22b at the half pitches, the wafer transporting pick 11a carries the wafers W in sequence, in the retention grooves 28a of the part 22a from its upside downwardly and similarly, carries the wafers W in sequence, in the retention grooves 28b of the part 22b from its upside (closer to the first holding part 22a) downwardly. To the contrary, in case of accommodating the wafer W in the holding parts 22a, 22b at intervals of a pitch more than the normal pitch, it is possible to accommodate the wafers W in optional positions. It is noted that the wafer transporting pick 11a itself is formed to have a constant thickness and, after holding the wafers W in the retention grooves 28a, 28b, the pick 11a has to be lowered slightly and withdrawn from the gap between the holding members 22. That is, as the minimum clearance necessary for the loading operation of the pick 11a, there is required a gap of the normal pitch at least.

A gap between the first holding part 22a and the second holding part 22b corresponds to the normal pitch. Thus, it is possible to insert the wafer transporting pick 11a between the first holding part 22a and the second holding part 22b. For example, it is also possible to first Load the wafers W in the second holding part 22b at intervals of the half pitch and subsequently, load the wafers W in the first holding part 22a at intervals of the half pitch.

As for the distance between the opposing holding members 22 in the direction Y, a width on the moving side of the wafer transporting pick 11a (front side of FIG. 4, upside of FIG. 3) is generally equal to the diameter of the wafer W, while a width on the interior side (back side of FIG. 4, underside of FIG. 3) is smaller than the diameter of the wafer W in order to prevent the wafers W from falling from the arm 21 when changing the postures of the wafers W to their substantially-vertical postures. Again, the width on the interior side between the members 22 is established so that a wafer gripping member 41 (FIG. 2) of the wafer elevating mechanism 40 can penetrate therebetween. The other wafer posture changing device 20b has a structure in symmetrical with that of the wafer posture changing device 20a in the direction y. There is no difference in basic structure between the device 20a and the device 20b.

The water gripping member 41 of the wafer elevating mechanism 40 has grooves (see FIG. 2) formed to retain the wafers W. When the wafer gripping member 41 is elevated from the underside of the wafers W held by the wafer posture changing device 20a, the wafer gripping member 41 can pass through the members 22 while receiving the wafers W held therebetween, and move up to the wafers W held by the rotor 34. Under condition of positioning the arm 21 of the wafer posture changing device 20b between the gripping member 41 and the rotor 34, on the other hand, when moving the wafer gripping member 41 up to the rotor 34, successively transferring the cleaned wafers W from the rotor 34 to the gripping member 41 and subsequently lowering the gripping member 41, the wafers W are transferred from the gripping member 41 to the wafer holding arm 21 of the wafer posture changing device 20b on the wafers' descending way.

In connection, if the grooves of the wafer gripping member 41 are formed at intervals of a quarter pitch of the normal pitch and the wafer gripping member 41 can move in the direction X by a quarter pitch of the normal pitch, then it becomes possible to use the grooves for gripping the unprocessed wafers W and the grooves for gripping the processed wafers W appropriately. As a result, it is possible to prevent the adhesion of particles to the wafers W after completing the cleaning process.

For instance, the wafer posture changing devices 20a, 20b operate as follows. First, the wafer posture changing device 20a receives the unprocessed wafers W in their substantially-horizontal postures from the wafer transporting pick 11a (not shown in FIG. 5A) at a position of FIG. 5A opposing the window 15a. Then, the wafer posture changing device 20b stands ready in the position of FIG. 5A (under the rotor 34). After completing the loading of the wafers W in designated number to the device 20a, the wafer protrusion-proof member 27 is brought into abutment with wafers W in order to prevent their protrusion.

Figures 5A, 5D:
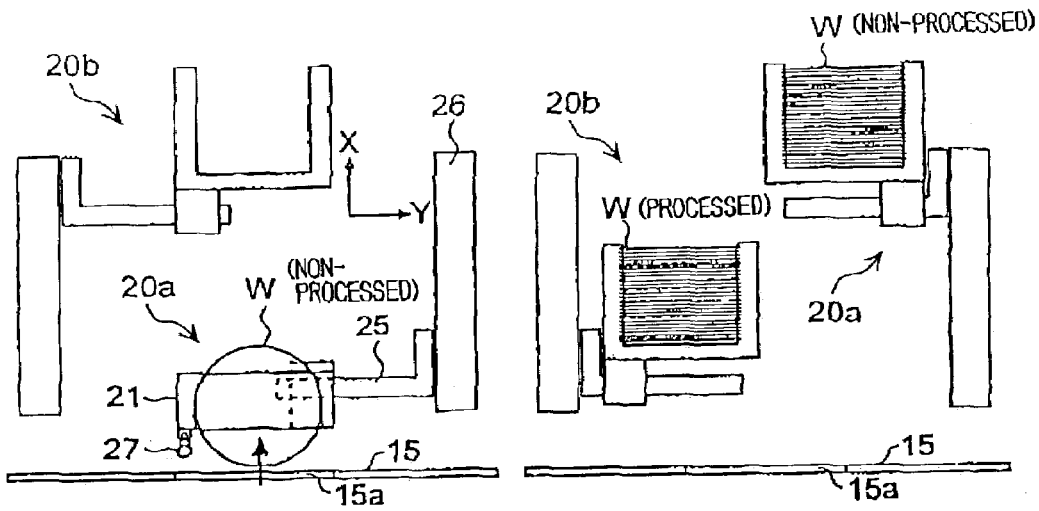
FIGS. 5A, 5B, 5C, 5D, 5E and 5F are explanatory views showing the movements of the wafer posture changing devices.
Figure 5B:
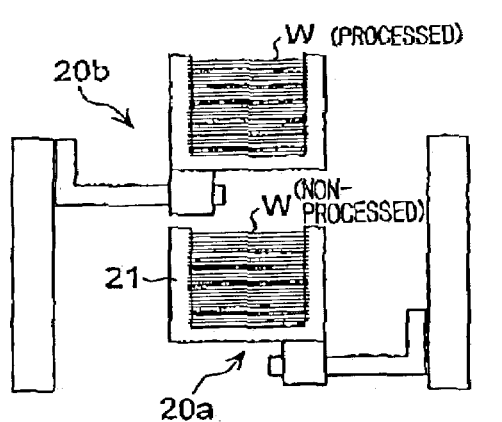

Next, as shown in FIG. 5B, the wafer posture changing device 20a changes the postures of the wafers W to their substantially-vertical postures due to the operation of the arm rotating mechanism 23. While, the wafer holding arm 21 of the other wafer posture changing device 20b receives the cleaned wafers W (substantially-vertical postures) from the wafer gripping member 41 (not shown in FIG. 5B). After receiving the wafers W, the wafer protrusion-proof member 27 (not shown in FIG. 5B) of the device 20b is brought into abutment with wafers W in order to prevent their protrusion.

Figure 5E:
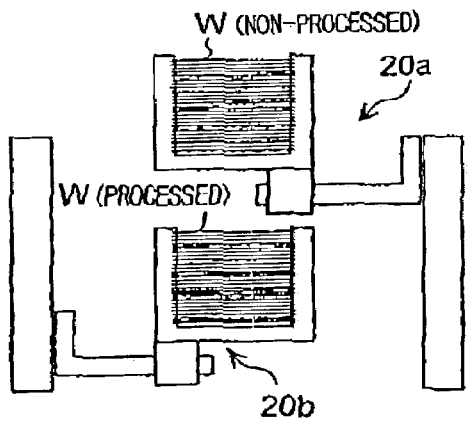
Figure 5C:
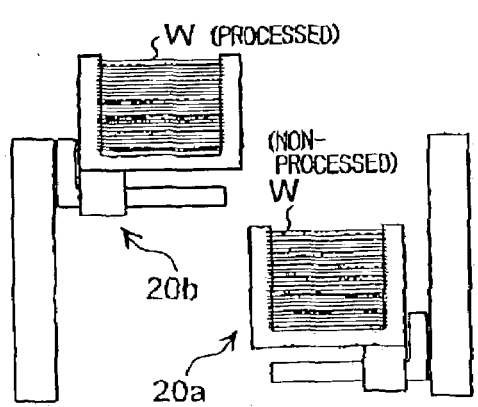

Next, as shown in FIG. 5C, the Y-directional slide member 24 of the device 20a moves toward the X-directional guide 26. As a result, the wafer holding arm 21 of the device 20a approaches the X-directional guide 26. Similarly, the wafer holding arm 21 of the other device 20b approaches the X-directional guide 26. Next, as shown in FIG. 5D, the Y-directional guide 25 of the device 20a moves apart from the boundary wall 15 in the direction X, while the Y-directional guide 25 of the device 20b approaches the boundary wall 15.

Successively, as shown in FIG. 5E, the Y-directional slide member 24 of the device 20a moves toward the end of the Y-directional guide 25 in order to transfer the unprocessed wafers W from the arm 21 to the wafer gripping member 41. While, in the wafer posture changing device 20b, the wafer holding arm 21 moves to a position opposing the window 15, in the direction Y.

Figure 5F:
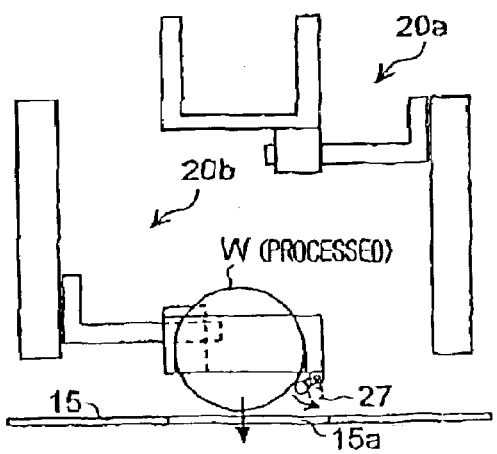

Finally, as shown in FIG. 5F, the wafer protrusion-proof member 27 of the device 20a is withdrawn and thereafter, the wafer W on the arm 21 are accommodated in the rotor 34 (not shown in FIG. 5F) through the wafer gripping member 41 (also not shown in FIG. 5F). As a result, the wafer posture changing device 20a is emptied with no wafer. While, in the wafer posture changing device 20b, the postures of the wafers W are changed to their substantially-horizontal postures and thereafter, the wafer protrusion-proof member 27 is unlocked. Consequently, it becomes possible for the wafer transporting pick 11b (not shown in FIG. 5F) to carry the wafers W out of the wafer holding arm 21 of the device 20b.

In the wafer posture changing device 20b, if the wafers W are accommodated in both of the first holding part 22a and the second holding part 22b at intervals of the half pitch, the insertion of the pick 11b between the first holding part 22a and the second holding part 22b allows the first discharge of the wafers W out of the first holding part 22a and the second discharge of the wafers W out of the second holding part 22b.

After completing such a series of actions, the wafer posture changing devices 20a, 20b are together emptied with no wafer. With the reverse actions from FIG. 5F to FIG. 5A, it is possible to return to the state of FIG. 5A. In connection with the above series of actions, there is ensured a predetermined gap between the wafer holding arms 21 in order to avoid the interference of the water holding arm 21 of the device 20a with that of the device 20b.

In the cleaning unit 4, the rotor 34 is provided, between opposing disks 37a and 37b, with engagement members 38a and an openable/closable holder 38b. The engagement members 38a and the holder 38b each includes not-shown grooves for holding the wafers W therein. These grooves are formed in the same pattern as that of the wafer holding member 22. A closing mechanism for the holder 38b is not shown in the figure. As mentioned before, the rotor 34 is capable of holding the wafers W, which have been held in their substantially-vertical postures by the wafer posture changing device 20a, as they are. Owing to the accommodation of the wafers W at intervals of the half pitch, the rotor 34 can hold the wafers W twice as many as the wafers W are accommodated in the same rotor 34 at intervals of the normal pitch.

A rotating shaft 35 is fixed to the rotor 34. The rotating shaft 35 is connected to a motor 31. The drive of the motor 31 allows the rotating shaft 35 to be rotated, thereby rotating the rotor 34. The rotating shaft 35 penetrates a bearing member 32 for bearing the rotating shaft 35 and also a lid body 33. Both the motor 31 and the bearing member 32 are connected with an X-directional slide mechanism 36. By the X-directional slide mechanist 36, all of the rotor 34, the rotating shaft 35, the motor 31, the bearing member 32 and the lid body 33 are slidable in one body along the direction X. In this way, it is possible to make the rotor 34 enter the outer chamber 71a and withdraw therefrom.

Figure 7:
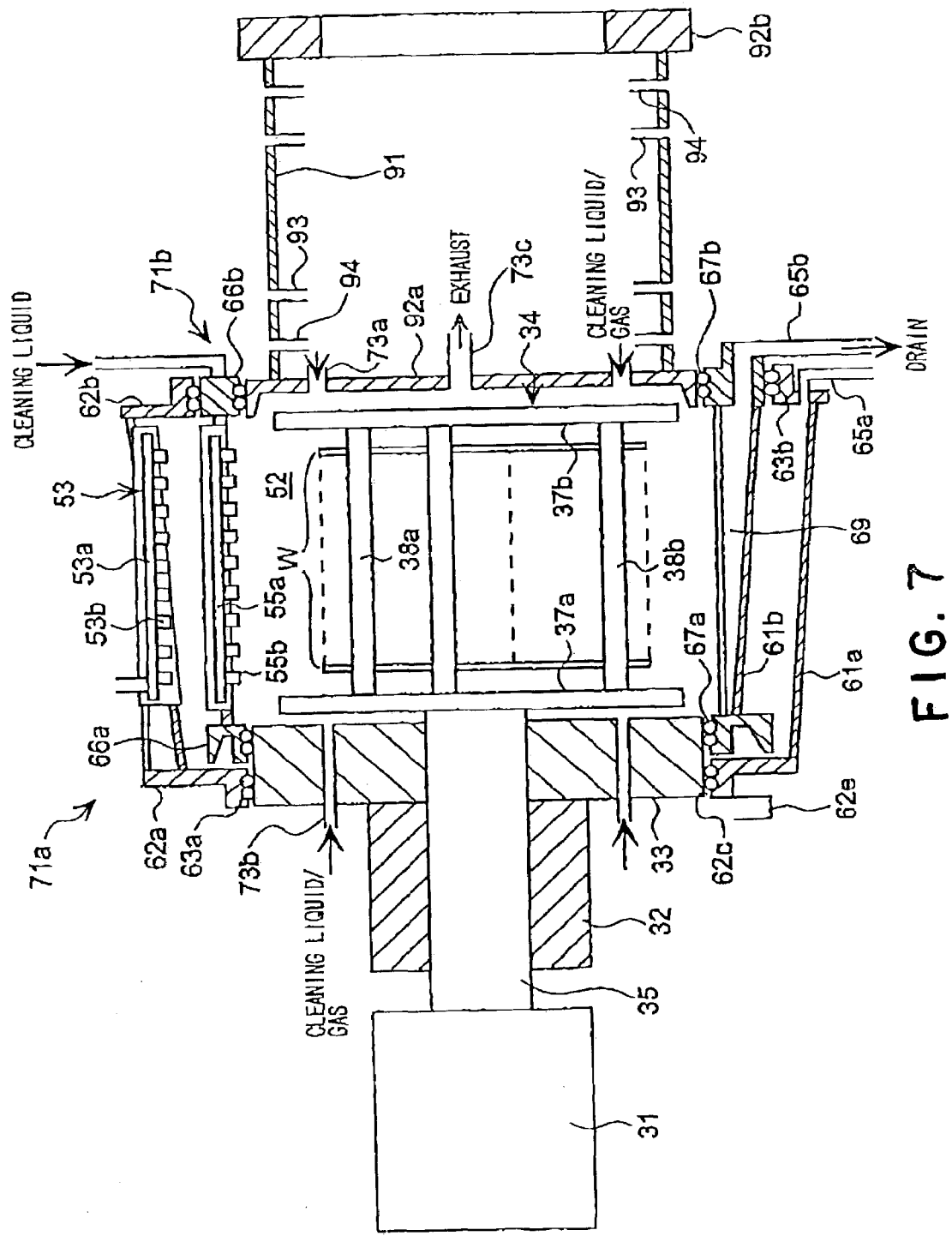
FIG. 7 is a sectional view showing another condition that the rotor goes into the outer chamber.

As shown in FIG. 7 later, the lid body 33 closes a rotor port 62c of the outer chamber 71a in a condition where the rotor 34 is accommodated in the outer chamber 71a. Not-shown bearings are arranged between the rotating shaft 35 and the bearing member 32 and also between the rotating shaft 35 and the lid body 33 to facilitate the rotation of the shaft 35.

Figure 6:
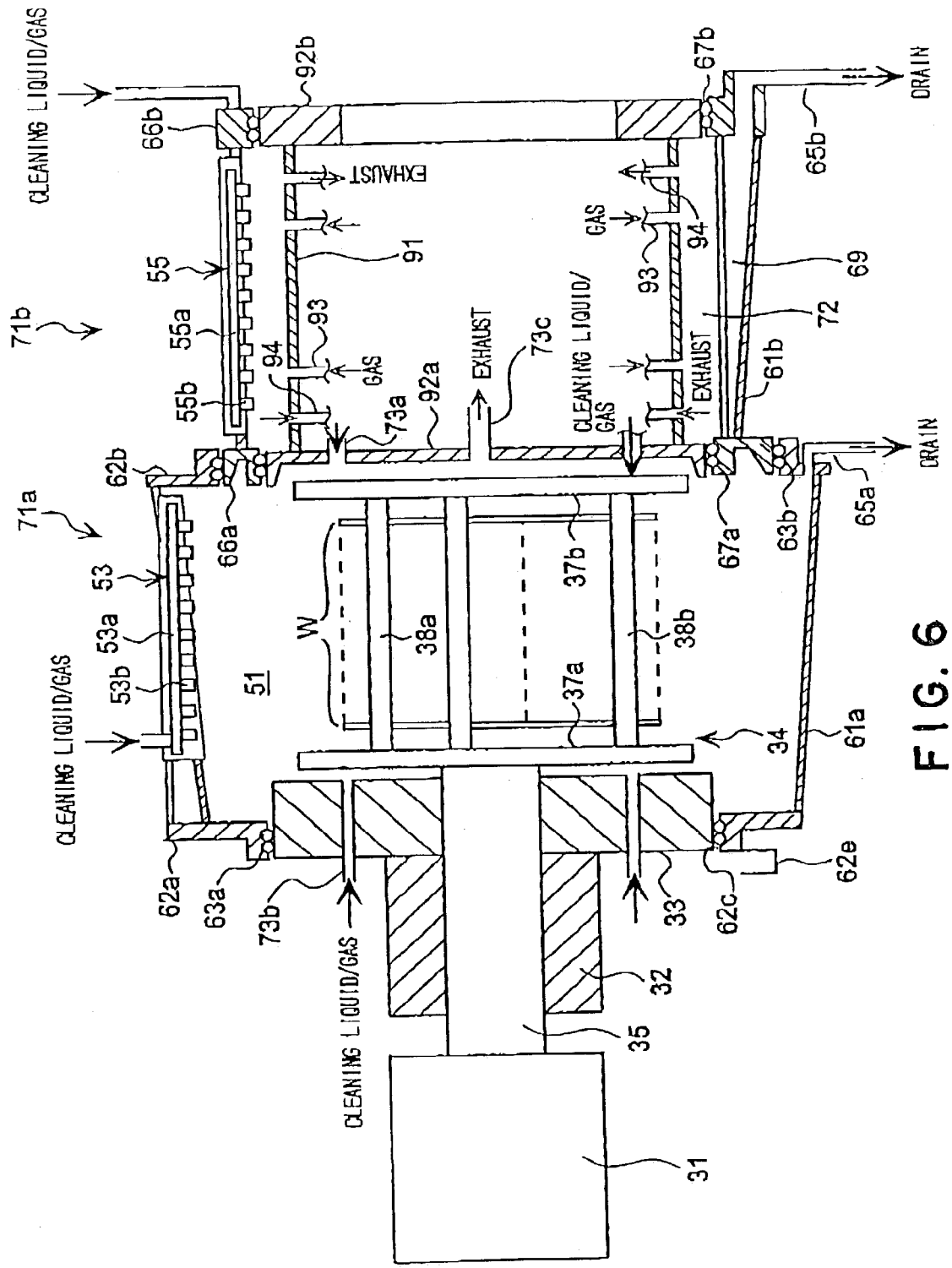
FIG. 6 is a sectional view showing one condition that a rotor goes into an outer chamber.

FIGS. 6 and 7 are sectional view each showing a condition that the rotor 34 enters the outer chamber 71a. The inner chamber 71b is supported by a not-shown X-directional slide mechanism, allowing the chamber 71b to enter and withdraw from the outer chamber 71a. FIG. 6 illustrates the inner chamber 71b being withdrawn out of the outer chamber 71a. FIG. 7 illustrates the inner chamber 71b being accommodated in the outer chamber 71a. The position of the inner chamber 71b of FIG. 6 will be called "withdrawal position", hereinafter. While, the position of the inner chamber 71b of FIG. 7 will be called "processing position", hereinafter.

The outer chamber 71a has a cylindrical body 61a, ring members 62a, 62b which are arranged on both ends of the cylindrical body 61a respectively, a seal mechanism 63a on an inner circumferential face of the ring member 62a, another seal mechanism 63b on an inner circumferential face of the ring member 62b and a fluid ejector nozzle 53 for supplying the wafers W in the rotor 34 with cleaning liquid and gas. The nozzle 53 is attached to the cylindrical body 61a. Further, the outer chamber 71a is provided, on an underside thereof, with an exhaust pipe 65a for discharging the cleaning liquid and gas from the chamber 71a.

The inner chamber 71b has a cylindrical body 61b, ring members 66a, 66b which are arranged on both ends of the cylindrical body 61b respectively, a seal mechanism 67a on an inner circumferential face of the ring member 66a, another seal mechanism 67b on an inner circumferential face of the ring member 66b and a fluid ejector nozzle 55 for supplying the wafers W in the rotor 34 with cleaning liquid and gas. The nozzle 55 is attached to the cylindrical body 61b. Further, the inner chamber 71b is provided, on an underside thereof, with an exhaust pipe 65b for discharging the cleaning liquid and gas from the chamber 71b.

At the withdrawal position of the inner chamber 71b, there is a cylindrical body 91 to be accommodated in the inner chamber 71b. The cylindrical body 91 is provided, on both ends thereof, with a disk 92a and a ring member 92b respectively. The disk 92a is equipped with fluid nozzles 73a and an exhaust pipe 73c, while the ring member 92b is equipped with gas nozzles 93 and exhaust pipes 94.

An inner opening of the ring member 62a has an inner opening forming the above rotor port 62c through which the rotor 34 enters and withdraws from the outer chamber 71a.

While the rotor 34 enters the outer chamber 71a, the rotor port 62c is closed up by the lid body 33 and the gap between the outer circumferential face of the lid body 33 and the port 62c is sealed up with the seal mechanism 63a. The ring member 62a is provided, on its exterior lower part, with a tray 62e for cleaning liquid or the like. This tray 62e is provided to prevent the cleaning liquid etc., which has adhered to the lid body 33 and the seal mechanism 63a, from falling from the port 62c when the rotor 34 withdraws from the outer chamber 71a.

As shown in FIG. 6, when the inner chamber 71b is in the withdrawal position, the gap between the ring member 66a and the ring member 62b is sealed up with the seal mechanism 63b, while the gap between the ring member 66a and the disk 92a is sealed up with the seal mechanism 67a. Since the rotor port 62c is blocked up with the lid body 33 and the seal mechanism 63a, there is defined a processing chamber 51 on condition that the inner chamber 71b is in the withdrawal position.

As shown in FIG. 7, when the inner chamber 71b is in the processing position, the gap between the inner circumferential face of the ring member 66a and the lid body 33 is sealed up with the seal mechanism 67a, while the gap between the ring member 66b and the ring member 62b is sealed up with the seal mechanism 63b. In addition, the gap between the ring member 66b and the disk 92a is sealed up with the seal mechanism 67b. In this way, there is defined a processing chamber 52 on condition that the inner chamber 71b is in the processing position.

As for the cylindrical body 61a defining the outer chamber 71a, the diameter on the side of the ring member 62b is larger than that on the side of the ring member 62a, providing the cylindrical body 61a with a slope that lowers the lower end of the member 62b in comparison with the lower end of the member 62a. When the processing chamber 51 is defined in the above way, various cleaning liquids ejected from the nozzle 53 to the waters W flow on the bottom of the cylindrical body 61a from the side of the ring member 62a to the side of the ring member 62b and successively leave the chamber 51 through the exhaust pipe 65a.

In order to facilitate the drainage of the cleaning liquids, the cylindrical body 61b has a groove 69 formed to project therefrom with a predetermined slope. For instance, when the processing chamber 52 is defined by the inner chamber 71b, the cleaning liquids ejected from the nozzle 55 to the wafers W flow in the groove 69 and successively leave the chamber 52 through the exhaust pipe 65b.

The fluid ejector nozzle 53 comprises a nozzle body 53a in the form of a rod extending in one direction, the body 53a having a chemical passage formed therein and many nozzle tips 53b attached to the body 53a at regular intervals in the longitudinal direction. Each nozzle tip 53b has an ejection recess (not shown) formed therein to communicate with the chemical passage of the body 53a. By means of screwing or the like, the nozzle tips 53b are secured to the nozzle body 53a.

Supplied to the above-mentioned ejector nozzle 53 are deionized water (pure water), IPA-liquid both from a chemical unit 6 and dry gas, e.g. nitrogen-gas ($N_2$), all of which are ejected against the wafers W in the rotor 34 subsequently. For instance, the pure water etc. is ejected from the nozzle 53 while spreading in a substantially-conical pattern.

Similarly to the nozzle 53, the fluid ejector nozzle 55 consists of a nozzle body 55a and many nozzle tips 55b each having an ejection recess. Various cleaning liquids (e.g. various chemicals, pure water, IPA-liquid, etc.) are supplied from the chemical unit 6 to this ejector nozzle 55 and subsequently, the cleaning liquids are ejected against the wafers W in the rotor 34. For instance, the chemical liquid etc. is ejected from the nozzle 55 while spreading in a fan pattern. Although FIGS. 6 and 7 each illustrates the single nozzle 53 and the single nozzle 55, they may be provided as a plural in the modification. Further noted that the nozzles 53, 55 do not always have to be arranged at the uppermost parts of the cylindrical bodies 61a, 61b, respectively.

As mentioned before, the disk 92a is equipped with the fluid nozzles 73a that can eject the deionized water for cleaning the disk 37b and dry gas for drying it. The lid body 33 is equipped with fluid nozzles 73b that can eject the deionized water for cleaning the disk 37a and the dry gas for drying it. The exhaust pipe 73c of the disk 92a are provided to scavenge the processing chambers 51, 52. Noted that it is also possible for the fluid nozzles 73a, 73b to eject oxygen gas ($O_2$), carbon dioxide gas ($CO_2$), etc., thereby establishing designated gaseous atmospheres in the processing chambers 51, 52.

When the inner chamber 71b is in the withdrawal position, there is produced a narrow annular space 72 between the outer circumferential face of the cylindrical body 91 and the inner circumferential face of the cylindrical body 61b owing to the seal mechanism 67a between the ring member 66a and the disk 92a and the seal mechanism 67b between the ring member 66b and the ring member 92b. The annular space 72 may be utilized for cleaning the inner chamber 71 with water.

For example, it is first carried out for the nozzle 55 to eject the pure water into the annular space 72 and thereafter, the ejected pure water is discharged from the space 72 through the exhaust pipe 65b. Subsequently, the dry gas, such as nitrogen gas, is ejected from the nozzles 93 of the cylindrical body 91 to discharge gas/liquid through the exhaust pipes 94 of the cylindrical body 91 and the exhaust pipe 65b of the inner chamber 71b. In this way, the inner chamber 71b can be cleaned with water. Alternatively, it may be adopted to allow the fluid ejector nozzle 55 to vomit the dry gas while supplying the pure water through the nozzles 93. Then, with the ejection of pure water through the nozzle 55, it becomes possible to perform the water-washing of the nozzle 55 after ejecting the chemical liquid at the same time of washing the inner chamber 71b.

The chemical unit 6 includes tanks 81 for storing various cleaning liquids, for example, the chemical liquid and the IPA-liquid to be ejected from the nozzle 55, pumps (not shown) for feeding the chemical liquids from the tanks 81 to the nozzle 55, a switch for switching the exterior supply of pure water, nitrogen gas, etc. to the supply of chemicals, and vice versa, a leakage sensor for detecting the leakage of flammable gas, a fire detecting sensor, a digestive nozzle and so on. The cleaning unit 4 is provided with a leakage sensor, a fire detecting sensor and a digestive nozzle, as well.

The process control unit 7 is equipped with a control device 8b for carrying out the cleaning operation at the cleaning unit 4 in accordance with a predetermined recipe. In a space beneath the foup stages 2a to 2d, a control device 8a is arranged to drive various instruments, for example, the wafer transporting device 11, the wafer posture changing device 20b, etc. in accordance with designated recipes. In operation, the control devices 8a, 8b mutually give and take control signals to carry out the processing operations of the cleaning apparatus 1 smoothly. Noted that it is possible to arrange a manipulation panel for operating the cleaning apparatus 1 on a side panel of either the wafer transporting unit 3 or the cleaning unit 4.

Next, regarding an operation to clean the wafers W accommodated in two foups F, which will be called "foup F1" and "foup F2" hereinafter, by means of the cleaning apparatus 1, the process for the operation will be described with reference to the flow chart of FIG. 8. Here, it is assumed that the foup F1 and the foup F2 are carried in and out of the foup loading/unloading part 2 in this order, by an automatic transporting device and that the foup F1 is mounted on the foup stage 2a, while the foup F2 is mounted on the foup stage 2b. Additionally, it is assumed that the wafer transporting pick 1a always carries the wafers W out of the foup F1 on the foup stage 2a and subsequently carries the wafers W out of the foup F2 on the foup stage 2b. Consequently, it is possible to simplify control programs for the automatic transporting device and the wafer transporting device 11 and also possible to abolish processing errors caused by altering the transportation order of the foups F1 and F2, facilitating the process control.

At first, at step S1, it is executed for the automatic transporting device to load the foup F1 accommodating twenty-five wafers W therein to the foup loading/unloading part 2 and mount the foup F1 on the foup stage 2a. At next step S2, it is executed to move the shutter moving mechanism 12 in order to detach the lid body 9 from the foup F1, so that the interior of the foup F1 communicates with the interior of the wafer transporting unit 3. Further, the shutter elevating mechanism 16 is driven to open the window 15a. At this time, as shown in FIG. 5A, it is executed to allow the wafer holding arm 21 to stand ready in a position opposing the window 15a so that the wafer posture changing device 20a can receive the wafers W in their substantially-horizontal postures.

At step S3, by allowing the wafer transporting pick 11a to have access to the foup F1, it is carried out to unload the wafers W from the foup F1 one by one. The wafers W are loaded into the first holding part 22a of the wafer holding members 22 of the wafer holding arm 21. For example, the wafers W are carried out of the foup F1 in order from the bottom side (in order from the slot #1). The carried-out wafers W are carried into the retention grooves 28a of the first holding part 22a in sequence from the top. In this way, twenty-five wafers W are held in the first holding part 22a at intervals of the half pitch.

At step S4, for the period of steps S2 and S3, it is carried out for the automatic transporting device to load the foup F2 into the foup loading/unloading part 2. Further, it is executed to load the wafers W accommodated in the foup F2 into the second holding part 22b in the same order as the order of loading the wafers W accommodated in the foup F1 into the first holding part 22a. The loading of the wafers W into the second holding part 22b is also carried out in sequence from the upside of the retention grooves 28b (on the side of the first holding part 22a). In this way, twenty-five wafers W are held in the second holding part 22b at intervals of the half pitch. When fifty wafers W are held between the wafer holding members 22, the shatter elevating mechanism 16 is actuated to close up the window 15a.

In accordance with the procedure mentioned with reference to FIGS. 5A to 5F, at step S5, it is executed for the wafer posture changing device 20a to change the postures of the wafers W to their substantially-vertical postures. Further, it is executed to make the wafer holding arm 21 move up to a position to deliver the wafers W to the wafer gripping member 41. Subsequently, the wafer elevating mechanism 40 is operated to raise the wafer gripping member 41 from the underside of the wafers W to the upside. Thus, the wafers W held by the wafer holding arm 21 are delivered to the wafer gripping member 41.

For the period of performing the operation at step S5, the rotor 34 stands ready while opening the holder 38b. It is executed to stop the wafer gripping member 41 at its position to insert the wafers W into the rotor 34, temporarily. The gripping member 41 is lowered after closing the holder 38b. In this way, fifty wafers W are held in the rotor 34.

At the point of completing the process at step S6, the wafer posture changing devices 20a, 20b are brought into a condition shown in FIG. 5F. Noted that the wafer posture changing device 20b does not retain the wafers W. Therefore, at step S7, it is executed to drive the wafer posture changing devices 20a, 20b to respective positions of FIG. 5A so that the device 20b can receive the wafers W after the cleaning processing.

At step S8, it is executed for the X-directional slide mechanism 36 to slide the rotor 34 having the wafers W in the direction X and into the outer chamber 71a. Further, it is executed to make the inner chamber 71b enter the outer chamber 71b. The lid body 33 blocks up the wafer port 62c and the seal mechanisms 63a, 63b, 67a, 67b activate, thereby forming the processing chamber 52.

Next, at step S9, it is executed to perform the chemical processing with the supply of chemical liquid to the wafers W through the fluid ejector nozzle 55 while driving the motor 31 to rotate the rotor 34 at predetermined revolutions. At the chemical processing, it is preferable to alternately perform the following processes of: rotating the rotor 34 at low speed for a predetermined period so that the chemical liquid on the rotating wafers W flows toward the centers of the wafers W without being shaken tree of their peripheries due to centrifugal force; and rotating the rotor 34 at high speed for a predetermined period so that the chemical liquid adhering to the wafers W is shaken free of their peripheries due to centrifugal force. According to the above-mentioned processes, new chemical liquid adheres to the surfaces of the wafers W periodically. Therefore, with the progressed chemical processing, it is possible to shorten the processing time in total.

At step S10, it is executed to wash and dry the wafers W. In detail, after completing the chemical processing, it is carried out to eject IPA-liquid from the nozzle 55 while still forming the processing chamber 52, performing a pre-processing for the removal of chemical liquid adhering to the wafers W. Thereafter, the inner chamber 71b is shifted out of the outer chamber 71a to define the processing chamber 51. In this state, the fluid ejector nozzle 53 ejects the deionized water to wash the wafers W while rotating the rotor 34 at designated revolutions. After completing the washing process of the wafers W, nitrogen gas is blasted against the wafers W to dry them. During the washing process of the wafers W, it is carried out to wash and subsequently drying the inner chamber 71b while making use of the annular space 72 between the cylindrical body 91 and the inner chamber 71b, for the purpose of preparing the chemical processing for a forthcoming batch According to the above-mentioned cleaning process, it is possible to clean the wafers W twice as much as the conventional case where on batch processing is formed by twenty-five wafer W accommodated in the single foup F. Additionally, it is possible to reduce the amount of cleaning liquids (e.g. chemicals, water) required to cleaning one wafer.

After the process at step S10, the X-directional slide mechanism 36 is driven to withdraw the rotor 34 from the outer chamber 71a. Continuously, the wafer elevating mechanism 40 is operated to raise the wafer gripping member 41, achieving the wafers W being carried by the rotor 34 and also gripped by the member 41. When opening the holder 38b from the about state, the wafers W are released from the rotor 34, achieving the wafers W being gripped by the member 41 only. Next, the wafer gripping member 41 is lowered. On the same member's descending way, the wafers ware delivered to the wafer holding members 22 of the wafer holding arm 21 of the wafer posture changing device 20b (step S11).

At next step S12, following the procedure mentioned with reference to FIG. 5, the wafer posture changing device 20b transfers the wafers W up to a position to face the window 15a where the postures of the wafers W are changed to their substantially-horizontal postures. Consequently, it becomes possible for the wafer transporting pick 11b to unload the wafers W from the unit 4. Then, the wafer transporting pick 11b firstly carries out the wafers W, which have been held by the first holding part 22a and accommodated in the foup F1, in sequence from the bottom and further returns each wafer W to the original slot in the foup F1.

At next step S13, the automatic transporting device unloads the foup F1 having the so-returned wafers W from the foup loading/unloading part 2 and successively transports the foup F1 to a processing apparatus for performing the next process or the like. While, the wafer transporting pick 11b further carries out the wafers W, which have been accommodated in the foup F2 and held by the second holding part 22b, in sequence from the bottom and further returns each wafer W to the original slot in the foup F2 (step S14). At next step S25, the automatic transporting device unloads the foup F2 having the so-returned wafers W from the foup loading/unloading part 2 and successively transports the foup F2 to a processing apparatus for performing the next process or the like.

The reason why the above process can be carried out is that the gap between the first holding part 22a and the second holding part 22b of the wafer posture changing device 20b is the same as the above normal pitch thereby allowing the wafer transporting pick 11b to be inserted into the gap. If the gap between the first holding part 22a and the second holding part 22b is equal to the half pitch, the wafer transporting pick 11b could take the waters W out of the wafer posture changing device 20b only from the lowermost wafer W. Therefore, the wafer transporting pick 11b would return the wafers W to the foup F2 at first, allowing it to be discharged from the foup stage 2b. However, since the foup F1 is firstly discharged from the foup stage 2a under the normal control to transport the foups, the foup F2 had to stand ready for its withdrawal until the foup F1 is unloaded, deteriorating the transportation efficiency of the foups. Further, since no transportation of the wafers W is carried out in the wafer transporting unit 3 in a period from the discharge of the foup F1 from the foup stage 2a until a new foup having the wafers W to be processed next, which foup will be referred "foup F3" hereinafter, is mounted on the foup stage 2a, a problem of reducing the throughput of the apparatus would arise.

According to the above-mentioned cleaning process, however, it is possible to mount the foup F3 on the foup stage 2a after step S13 and also possible to mount a further new foup on the foup stage 2a. Noted that this foup contains the wafers W to be processed together with the wafers W of the foup F3 and will be referred "foup F4", hereinafter. That is, to accommodate the wafers W in the foup F1 mounted on the foup stage 2a in advance enables the foup F1 to be discharged from the foup loading/unloading part 2 instantly, enhancing the transportation efficiency of the foups.

Additionally, in a period that the wafer transporting device 11 allows the wafers W to be accommodated in the foup F2 or a period until the foup F2 is discharged from the foup loading/unloading part 2, it is possible to mount the foup F3 on the foup stage 2a. Further, since the unloading of the wafers W can be accomplished at once unless the wafer transporting device 11 is under rate-control to transfer the wafers W to the foup F2, the transporting efficiency of the wafers W in the apparatus 1 is enhanced to allow the throughput to be improved.

In order to transport the wafers W accommodated in two foups F to the wafer posture changing device 20b, the wafer transporting pick 11a acts to unload the wafers W in order from the foup F3 mounted on the foup stage 2a at first. Therefore, if mounting the foup F3 on the foup stage 2a as possible, then it is possible to abolish or shorten a period that no wafer is being transported in the wafer transporting unit 3. As a result, it is possible to improve the throughput of the cleaning apparatus 1.

Figure 8:
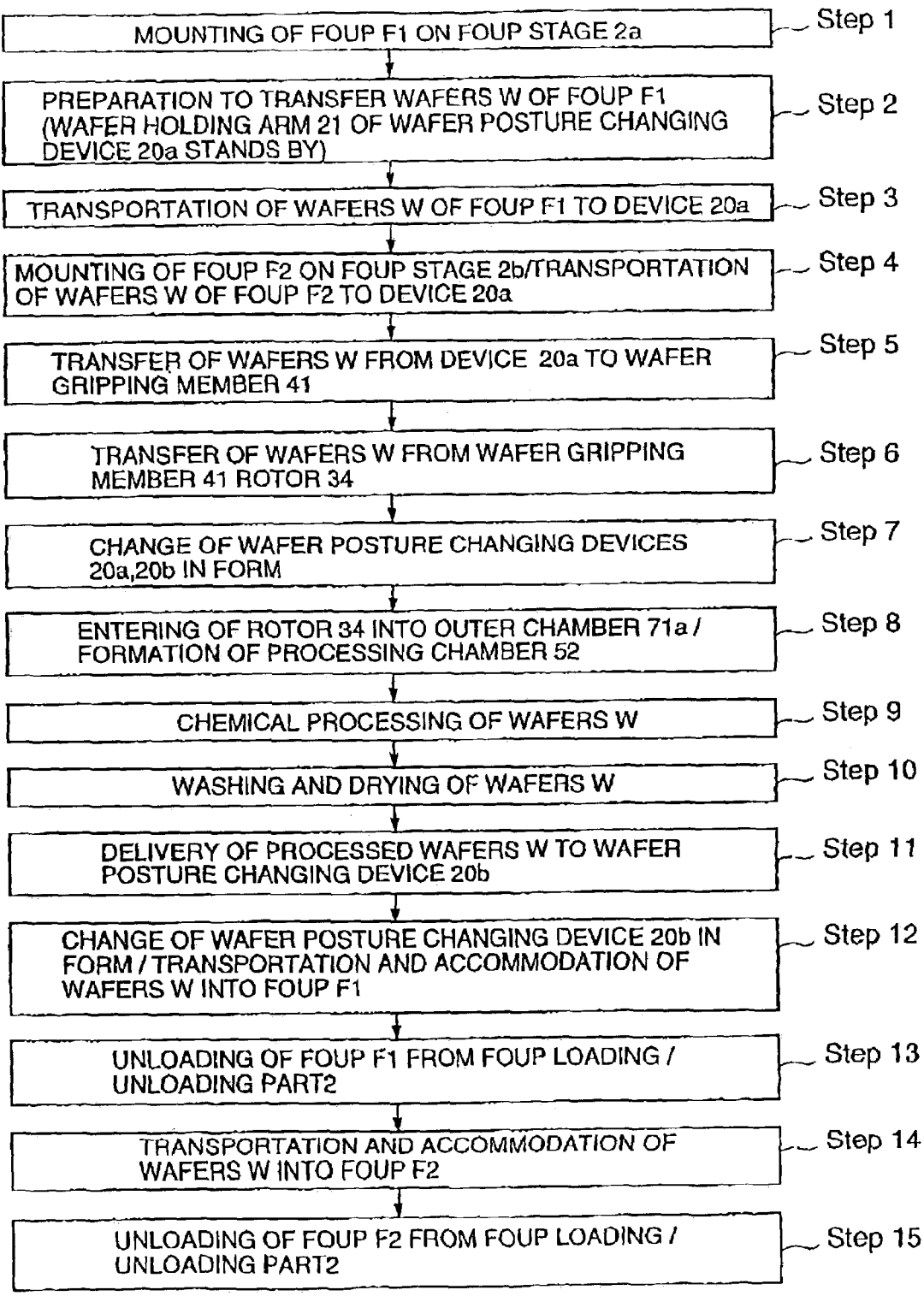
FIG. 8 is a flowchart explaining one form of a wafer cleaning method performed by the cleaning apparatus of FIG. 1.
Figure 9:
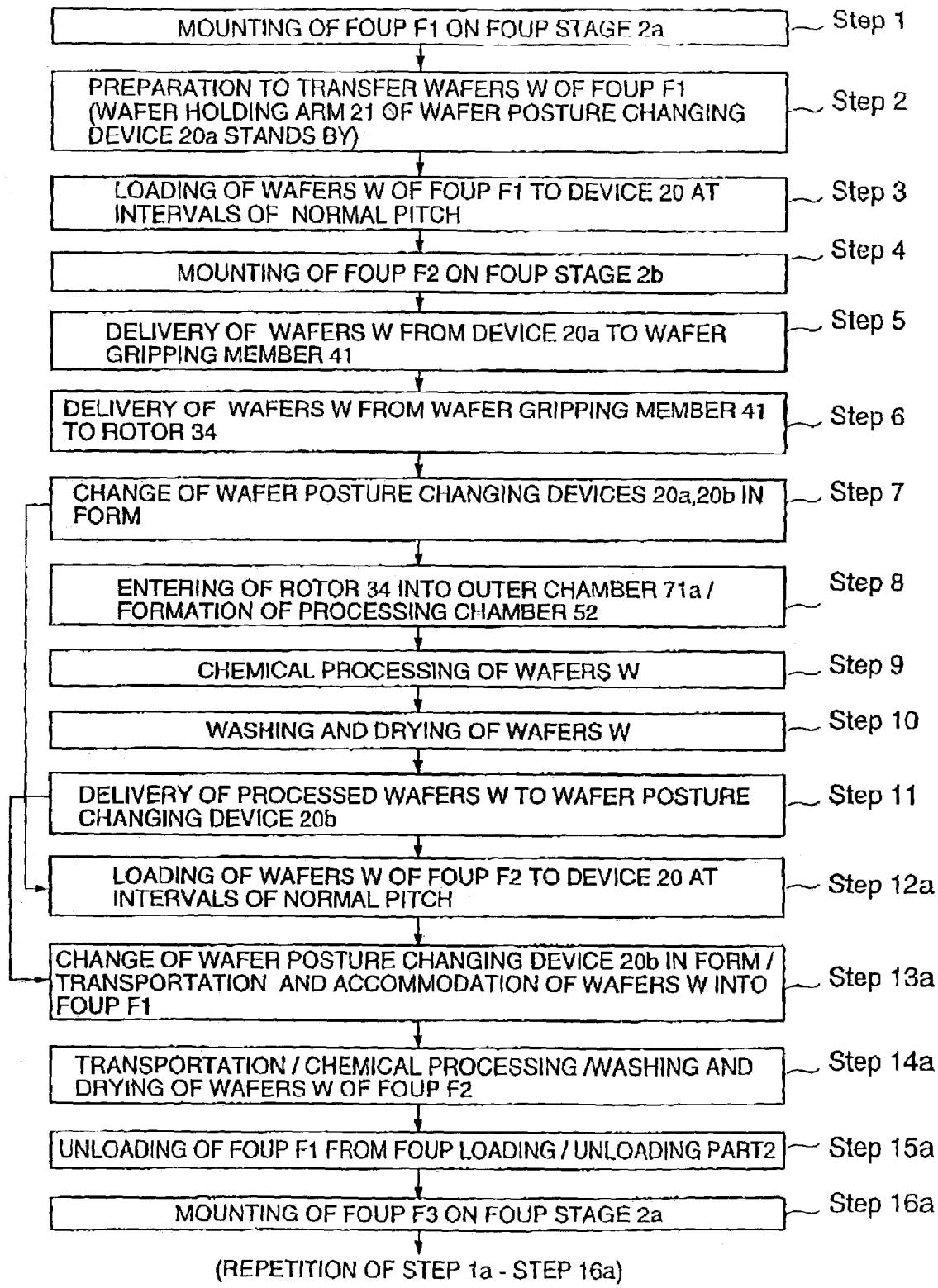
FIG. 9 is a flow chart explaining another form of the wafer cleaning method performed by the cleaning apparatus of FIG. 1.

Next, we describe another example of the cleaning operation of the apparatus 1 to clean the wafers W accommodated in two foups F1 and F2 with reference to a flow chart of FIG. 9. First of all, the operations at steps S1 and S2 of FIG. 8 are carried out as well. At next step S3a, it is executed to move the wafer transporting pick 11a to the foup F1. Successively, the wafer transporting pick 11a unloads the wafers W from the foup F1 one by one and loads the wafers W to the first holding part 22a and the second holding part 22b of the wafer holding members 22 of the wafer holding arm 21 at intervals of the normal pitch. In this process, the wafer W are discharged from the foup F1 in due order from its bottom side, while the carried-out wafers W are charged into the retention grooves 28a, 28b in the wafer holding members 22 in sequence from the uppermost groove, on alternate grooves. In this way, twenty-five pieces of wafers W are retained between the wafer holding members 22 at intervals of the normal pitch.

In execution of the processes of steps S2 and S3a, the automatic transporting device carries the foup F2 in the foup loading/unloading part 2 and further mounts the foup F2 on the foup stage 2b (step S4a). After the wafers W have been transferred from the foup F1 to the wafer holding members 22, preferably., the window 15a is closed once.

After step S4a, in accordance with the processes from step S5 to step S11 mentioned with reference to FIG. 8 previously, there are executed both of the transportation of the wafers W carried in the wafer posture chanting device 20a and the cleaning of the wafers W carried in the rotor 34. In execution of the above operations, at step S7, there is established a condition of FIG. 5A that the wafer posture changing device 20b can receive the cleaned wafers W and the wafer posture changing device 20a can receive the non-processed wafers W. As a result, for the period of carrying out the processes from step S8 to step S11, it is executed at step S12a to load the wafers W of the foup F2 to the wafer holding members 22 of the wafer posture changing device 20a at intervals of the normal pitch, in the same order as the procedure for loading the wafers W of the foup F1 to the wafer holding members 22 of the wafer posture changing device 20a.

In accordance with the procedure mentioned with reference to FIGS. 5A to 5F, the wafer posture changing device 20b moves the wafers W to a position facing the window 15a and further changes the postures of the wafers W to the substantially-horizontal postures on the same spot. Consequently, the wafers W can be carried out by the wafer transporting pick 11b. The wafer transporting pick 11b returns the wafers W held by the wafer holding members 22 of the wafer posture changing device 20b, to the predetermined positions in the foup F1 (step S13a). Then, the wafer transporting pick 11b can take out the wafers W held by the wafer holding members 22 of the wafer posture changing device 20b, in order from the top or the bottom, alternatively, at random.

While executing the process of steps S13a, the abovementioned processes of steps 5 to 11 for the wafers W in the foup F1 are applied to the wafers W held by the wafer posture changing device 20a, similarly (step S14a). At next step 15a, the automatic transporting device unloads the foup F1 having all the wafers W returned thereto, from the foup loading/unloading part 2 and successively transports the foup F1 to the processing apparatus etc. for the next process. After unloading the foup F1 out of the foup stage 2a, it is executed to mount the foup F3 on the foup stage 2a at step S16.

After completing the cleaning operation of the wafers W in the foup F2, it is executed to repeat the processes from step S1 to step S16a. That is, after unloading the wafers W for the foup F2 from the rotor 34, the wafers W are accommodated in the foup F2. Next, the foup F2 accommodating the wafers W therein is discharged from the foup stage 2b, while the foup F4 having the wafers W to be processed next is loaded on the foup stage 2b. On the other hand, after the wafers W of the foup F2 have been discharged from the rotor 34, the wafers W of the foup F3 are transferred from the wafer posture changing device 20a to the rotor 34 for the cleaning operation.

In this way, the cleaning apparatus 1 is also capable of cleaning the wafers W while holding them at intervals of the normal pitch as in the past. Additionally, it is also possible to perform the cleaning operation while allowing the rotor 34 to hold the wafers W at wide intervals as a result of multiplying the half-pitch by three or four. In case of carrying the wafers W at intervals of a pitch wider than the normal pitch, it is impossible to process all the wafers W accommodated in the single foup F in one batch processing. Nevertheless, the above method of holding the wafers W at wide intervals is effective for the situation such that a chemical liquid on use has high-viscosity and therefore, if the intervals of the wafers in the rotor 34 are narrow conversely, the chemical liquid might be supplied onto respective processing surfaces of the wafers W insufficiently, due to its high viscosity.

Figure 10:
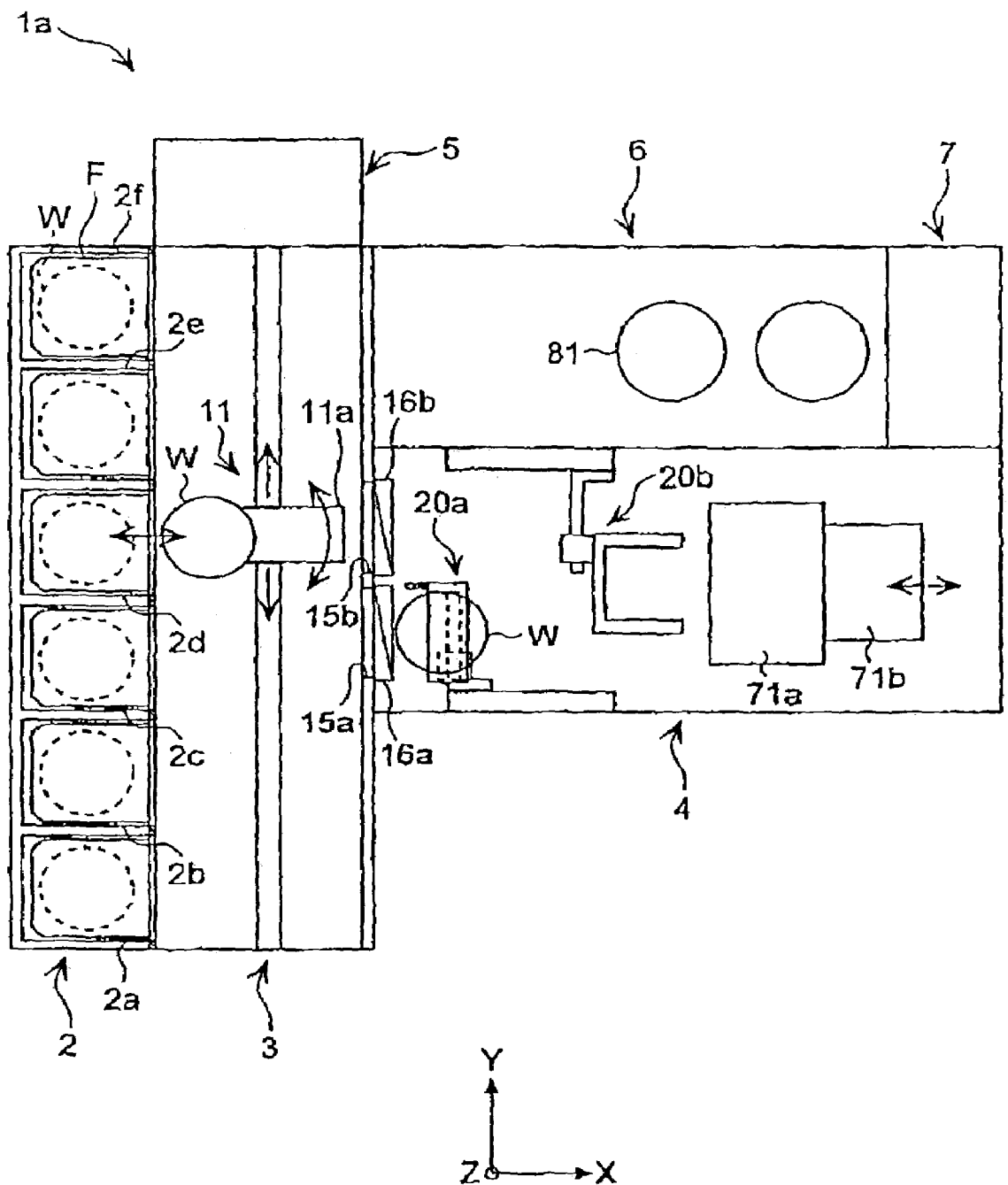
FIG. 10 is a plan view showing the schematic structure of another cleaning apparatus in accordance with the present invention.

Next, another embodiment of the invention will be described FIG. 10 is a plan view showing the schematic structure of a cleaning apparatus 1a of this embodiment. The cleaning apparatus 1a differs from the previous cleaning apparatus 1 in the following points of:

(1) providing six foup states 2a to 2f so that six foups F can be arranged in the foup loading/unloading in the direction Y;

(2) providing the boundary wall 15 separating the foup loading/unloading part 6 from the cleaning unit 4, with a window 15a that allows the wafer transporting pick 11a to transfer the wafers W to and from the wafer posture changing device 20a and another window 15b that allows the wafer transporting pick 11b to transfer the wafers W to and from the wafer posture changing device 20b; and (3) further providing the windows 15a, 15b with shutters 16a, 16b and shutter actuators (not shown) for moving the shutters 16a, 16b up and down, respectively. Noted that FIG. 1 illustrates the rotor 34 etc. in the cleaning unit 4, while FIG. 10 illustrates the wafer posture changing devices 20a, 20b in place of the rotor 34 in the cleaning unit 4.

FIGS. 11A to 11F are views explaining the delivery of the wafers W between the wafer transporting pick 11a and the wafer posture changing device 20a and also the delivery of the wafers W between the wafer transporting pick 11b and the wafer posture changing device 20b.

Figure 11A:
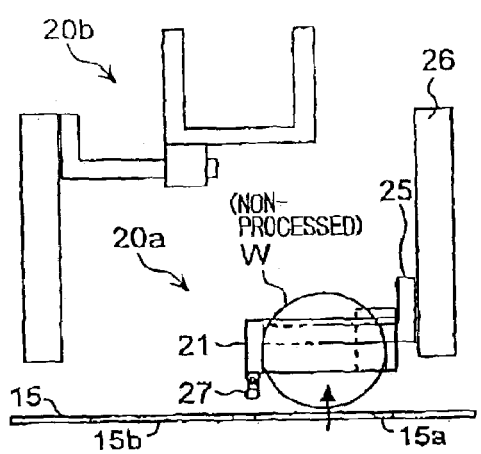
FIGS. 11A, 11B, 11C, 11D, 11E and 11F are explanatory views showing another motion form of the wafer posture changing device.

First, the wafer posture changing device 20a receives the unprocessed wafers W in their substantially-horizontal postures from the wafer transporting pick 11a (not shown in FIG. 11A) at a position of FIG. 11A opposing the window 15a. The n, the wafer posture changing device 20b stands ready in the position of FIG. 11A (under the rotor 34).

Figure 11D:
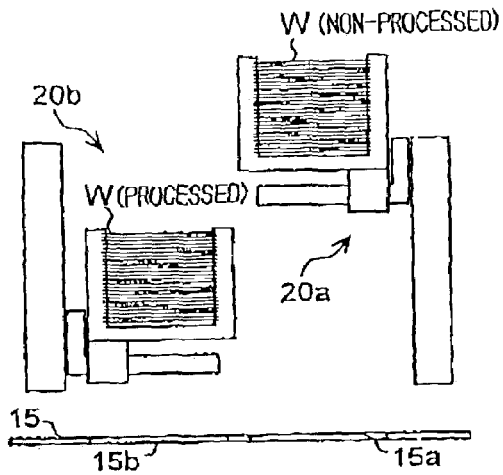
Figure 11B:
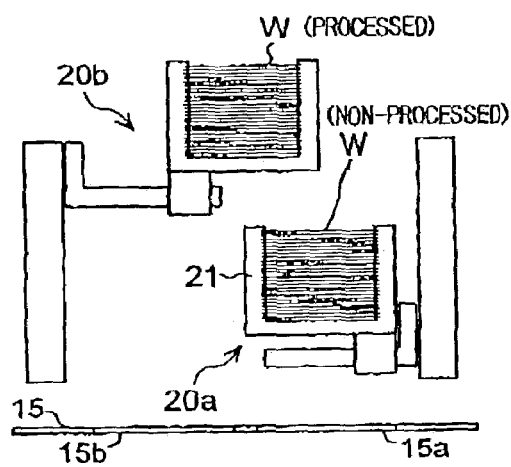

Next, as shown in FIG. 11B, the wafer posture changing device 20a changes the postures of the wafers W to their substantially-vertical postures due to the operation of the arm rotating mechanism 23. While, the wafer holding arm 21 of the other wafer posture changing device 20b receives the cleaned wafers W (vertical postures) from the water gripping member 41 (not shown in FIG. 11B). Next, as shown in FIG. 11C, the wafer holding arm 21 of the wafer posture changing device 20b moves toward the X-directional guide 26. In succession, as shown in FIG. 11D, the Y-directional guide 25 of the device 20a moves apart from the boundary wall 15 in the direction X, while the Y-directional guide 25 of the device 20b approaches the boundary wall 15. As a result, the wafer holding arm 21 of the wafer posture changing device 20b moves to a position facing the window 15b.

Figure 11E:
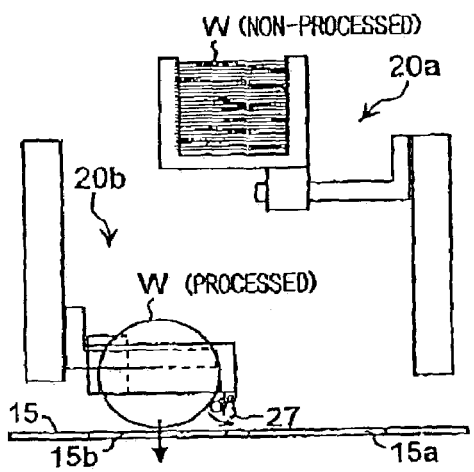
Figure 11C:
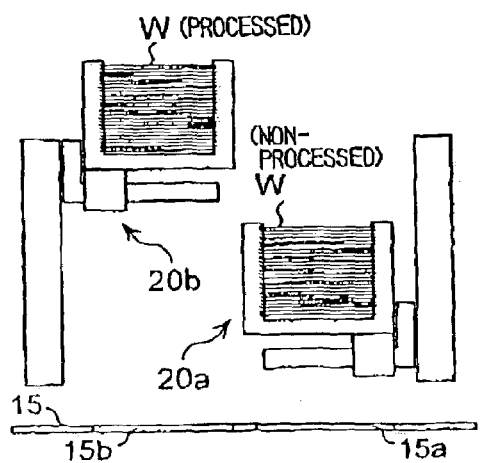

Successively, as shown in FIG. 11E, the Y-directional slide member 24 of the wafer posture changing device 20a moves toward the end of the Y-directional guide 25 in order to transfer the wafers W between the wafer holding arm 21 and the wafer gripping member 41. While, in the wafer posture changing device 20b, the wafer transporting pick 11b unloads the wafers W from the wafer holding arm 21 through the window 15b.

Figure 11F:
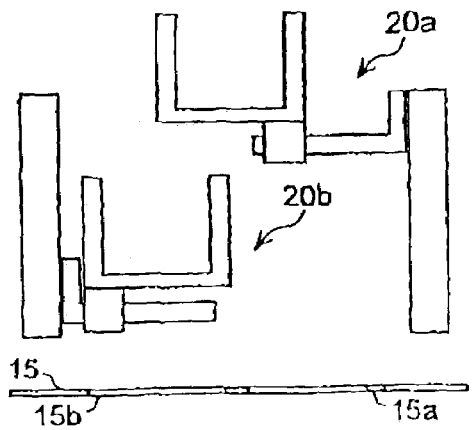

Finally, as shown in FIG. 11F, in the wafer posture changing device 20a, the wafers W held by the wafer holding arm 21 are accommodated in the rotor 34 (not shown in FIG. 11F) by the wafer gripping member 41 (also not shown in FIG. 11F). As a result, the wafer posture changing device 20a is emptied with no wafer. In the wafer posture changing device 20b, after discharging all the wafers W therefrom, the posture of the wafer holding arm 21 is changed to its substantially-horizontal posture in order to prepare to return the position of FIG. 11A.

Owing to the structures that allow the wafer transporting picks 11a, 11b to have access to the wafer posture changing devices 20a, 20b respectively, for example, if the foup F accommodating the wafers W is charged into the foup loading/unloading part 2 in the course that the wafer transporting pick 11b discharges the wafers W from the wafer posture changing device 20b, it is possible to transfer the wafers W from the foup F to the wafer posture changing device 20a with temporary discontinuation of the discharge of the wafers W from the wafer posture changing device 20b through the wafer transporting pick 11b. Consequently, it is possible to enhance the rate of operation of the rotor 34, allowing the throughput of the apparatus 1a to be improved.

Figure 12:
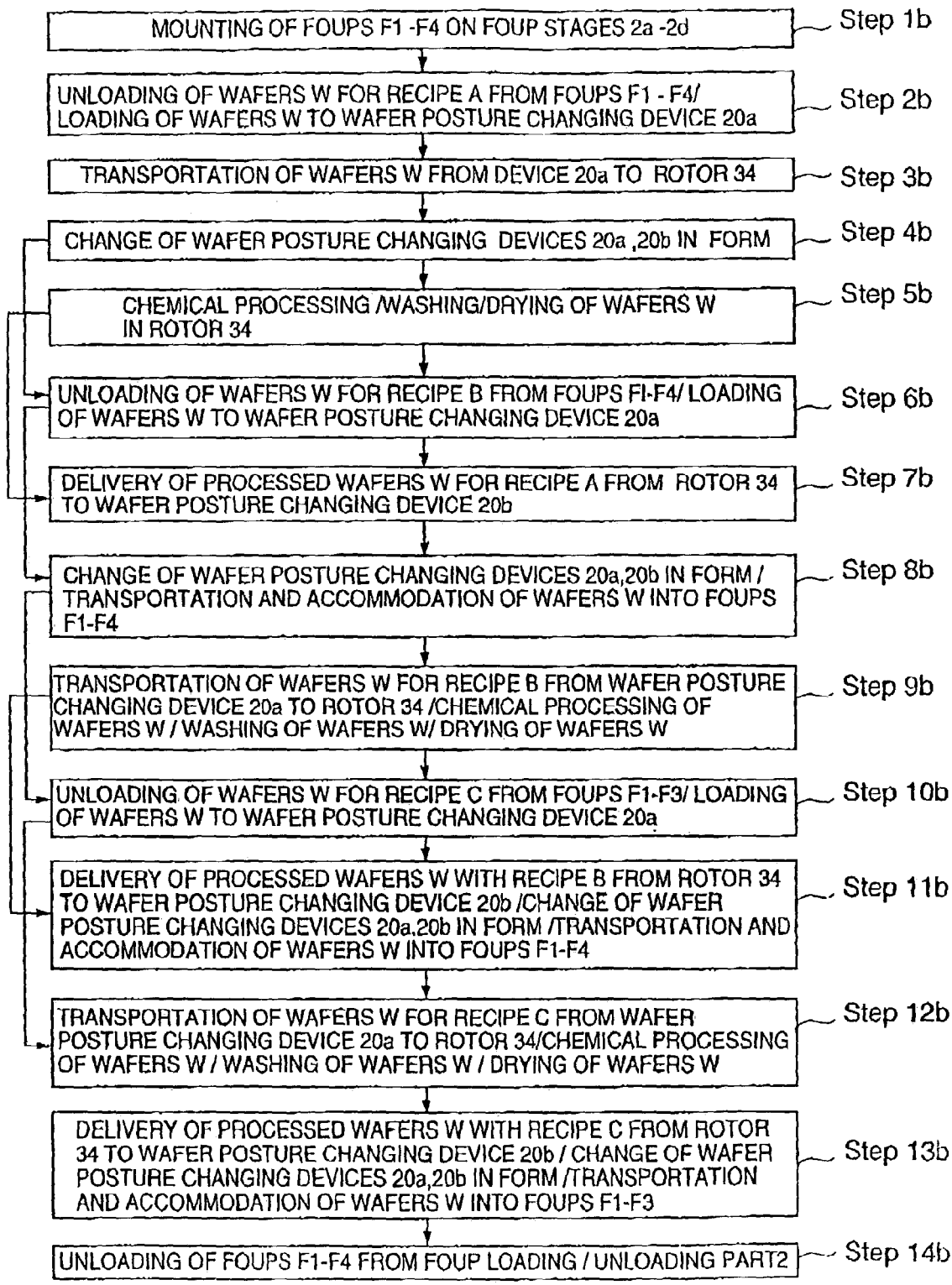
FIG. 12 is a flow chart explaining one form of the wafer cleaning method performed by the cleaning apparatus of FIG. 10.

One example of the cleaning method embodied by the above-mentioned cleaning apparatus 1a will be described with reference to a flow chart of FIG. 12. Here, we now describe a processing method of altering the composition of the wafers W to be supplied for the cleaning operation of one batch optionally. The processing method is accomplished by extracting the wafers W in prescribed number from multiple foups F, delivering the wafers W to the wafer posture changing device 20a and subsequently, making the rotor 34 carry the wafers W.

Table 1 shows the composition of the wafers W accommodated in four foups F1, F2, F3 and F4. For instance, in the foup F1, there are accommodated ten pieces of wafers W to be processed in accordance with the recipe A, ten pieces of wafers W to be processed in accordance with the recipe B and five pieces of wafers W to be processed in accordance with the recipe C. The numbers of wafers W accommodated in the foups F2, F3 and F4 and to be processed in accordance with the recipes A, B and C are respectively shown in Table 1. The differences among the recipes A, B and C are constituted by differences in terms of, for example, chemical liquid on use, processing time, intervals of the wafers W in the rotor 34, etc.

TABLE 1

|  | recipe A | recipe B | recipe C |
| --- | --- | --- | --- |
| foup F1 | 10 pcs. | 10 pcs. | 5 pcs. |
| foup F2 | 5 pcs. | 12 pcs. | 8 pcs. |
| foup F3 | 10 pcs. | 8 pcs. | 7 pcs. |
| foup F4 | 5 pcs. | 20 pcs. | non |

At step S1b, the foups F1 to F4 each accommodating twenty-five pieces of wafers W therein are successively carried in the foup loading/unloading part 2 and mounted on the foup stages 2a to 2d by the automatic transporting device. For the cleaning process with the recipe A, 10 pcs. of wafers W, 5 pcs. of wafers W, 10 pcs. of wafers W and 5 pcs. of wafers W (total: 30 pcs.) are unloaded from the prescribed slots in the foups F1 to F4, one by one, by the wafer transporting pick 11a. For example, the wafers W discharged from the foups F1 and F2 are loaded in the first holding part 22a of the wafer holding members 22 of the wafer posture changing device 20a at intervals of the half pitch. While, the wafers W discharged from the foups F3 and F4 are loaded in the second holding part 22b of the wafer holding members 22 at intervals of the half pitch (step S2b).

In accordance with the procedure mentioned with reference to FIGS. 11A to 11F, the wafer posture changing device 20a changes the postures of the wafers W to their substantially-vertical postures and further moves the wafer holding arm 21 up to a position to deliver the wafers W to the wafer gripping member 41. Subsequently, the wafer elevating mechanism 40 is operated to raise the wafer gripping member 41 from the underside of the wafers W to the upside. Thus, the wafers W held by the wafer holding arm 21 are delivered to the wafer gripping member 41 and continuously transferred from the wafer gripping member 41 to the rotor 34 (step S3b).

At the point of completing the process at step S3b, the wafer posture changing devices 20a, 20b are brought into a condition shown in FIG. 11F. Therefore, after completing the process of step S3b, it is executed to move the wafer posture changing devices 20a, 20b to respective positions of FIG. 11A so that the device 20b can receive the cleaned wafers W and the device 20a can receive the wafers W to be processed with the recipe B (step S4b).

Next, it is executed to make the rotor 34 carrying the wafers W enter the outer chamber 71a and also make the inner chamber 71b enter the outer chamber 71a thereby to define the processing chamber 52. Further, it is executed to perform the chemical processing with the supply of chemical liquid to the wafers W through the fluid ejector nozzle 55 while rotating the rotor 34 at predetermined revolutions. In succession, it is carried out to eject IPA-liquid from the nozzle 55, performing a pre-processing for the removal of chemical liquid adhering to the wafers W.

Next, at step S5b, the inner chamber 71b is moved to the withdrawal position outside the outer chamber 71a to define the processing chamber 51. In this state, the fluid ejector nozzle 53 ejects the deionized water to wash the wafers W while rotating the rotor 34 at designated revolutions. After completing the washing process of the wafers W, nitrogen gas is blasted against the wafers W to dry them. In the above way, the cleaning operation with the recipe A is ended. Noted that, during the washing operation of the wafers W, the washing/drying process of the inner chamber 71b is carried out to get ready for the chemical processing in a batch process in accordance with the next recipe B.

In execution of the process of step S5b, 10 pcs. of wafers W in the foup F1, 12 pcs. of wafers W in the foup F2, 8 pcs. of wafers W in the foup F3 and 20 pcs. of wafers W in the foup F4 (total: 50 pcs.) to be processed with the recipe B are loaded in the wafer holding members 22 of the wafer posture changing device 20a, one by one, at intervals of the half pitch (step S6b).

After withdrawing the rotor 34 from the outer chamber 71b, the wafer W on completion of the processing with the recipe A are transferred from the rotor 34 to the wafer gripping member 41 and further transferred from the member 41 to the wafer holding members 22 of the wafer holding arm 21 of the wafer posture changing device 20b (step S7b).

In accordance with the procedure mentioned with reference to FIGS. 11A to 11F, the wafer posture changing device 20b moves the wafers W to a position facing the window 15b and further changes the postures of the wafers W to the substantially-horizontal postures on the same spot. The wafer transporting pick 11b unloads the wafers W in order from the bottom-and returns them to the original slots in the foups F1 to F4 (step S8b). In parallel with step S8b, the wafers W to be processed with the recipe B, which are carried in the wafer posture changing device 20b, are delivered to the rotor 34 through the wafer gripping member 41 at step S9b. Then, the wafers W are cleaned under predetermined conditions, as similar to step S5b.

In execution of the cleaning process of step S9b, 5 pcs. of wafers W in the foup F1, 8 pcs. of wafers W in the foup F2 and 7 pcs. of wafers W in the foup F3 to be processed with the recipe C are loaded in the wafer holding members 22 of the wafer posture changing device 20a, one by one, at intervals of e.g. the normal pitch (step S10b).

On completion of the cleaning process with the recipe B, the wafers W are delivered from the rotor 34 to the wafer holding members 22 of the wafer holding arm 21 of the wafer posture changing device 20b in the similar order as steps 7b and 8b. Further, the wafers W are returned to the original slots in the foups F1 to F4 (step S11b). In parallel with step S11b, the wafers W to be processed with the recipe C, which are carried in the wafer posture changing device 20a, are delivered to the rotor 34 through the wafer gripping member 41. Additionally, the wafers W are cleaned under predetermined conditions, as similar to step S5b (step S12b).

On completion of the cleaning process with the recipe C, the wafers W are delivered from the rotor 34 to the wafer holding members 22 of the wafer holding arm 21 of the wafer posture changing device 20b in the similar order as steps 7b and 8b. Further, the wafers W are returned to the original slots in the foups F1 to F3 (step S13b). In this way, the cleaning operation with designated recipes for all the wafers W accommodated in the foups F1 to F4 is completed. The foups F1 to F4 having the wafers W returned thereinto are discharged from the foup loading/unloading part 2, one by one, by the automatic transporting device. Then, the automatic transporting device transfers the foups F1 to F4 to a processing apparatus for performing a forthcoming process and so on (step S14b).

Of course, it is also possible for the cleaning apparatus 1a to perform the cleaning operation of the wafers W by the method described with reference to FIGS. 8 and 9. For instance, when the foups F1 to F4 are mounted on the foup stages 2a to 2d respectively, it is carried out to transport the wafers W of the foups F1 and F2 to the wafer posture changing device 20a firstly and the rotor 34 subsequently, thereby performing the cleaning operation. In the meantime of cleaning operation, the wafers W of the foups F3 and F4 are transported to the wafer posture changing device 20a. Then, after discharging the wafers W of the foups F1 and F2 from the rotor 34, the wafers W of the foups F3 and F4 are loaded to the rotor 34. In this way, it is possible to enhance the rate of operation of the rotor 34, allowing the throughput of the apparatus 1a to be improved.

Figure 13:
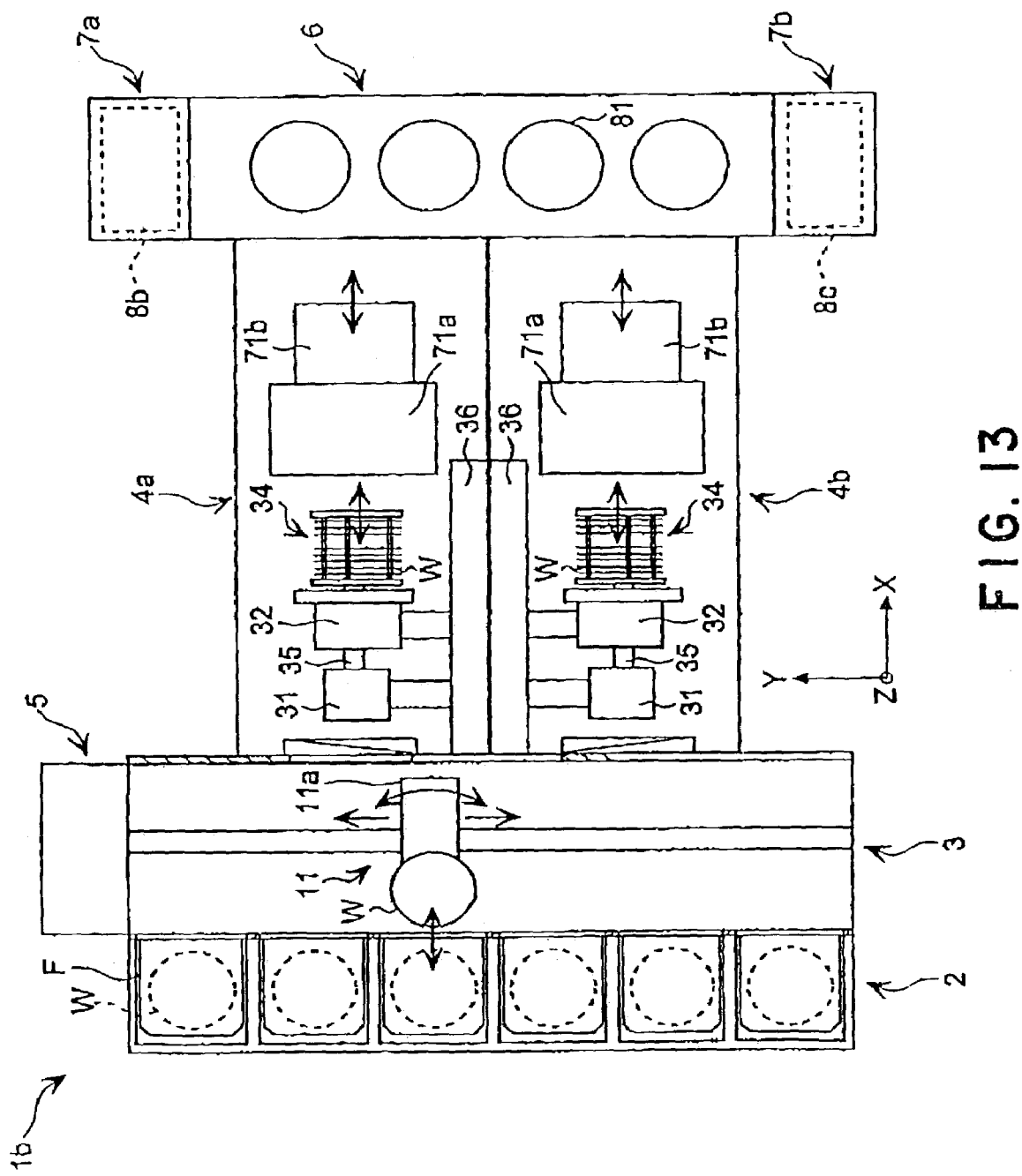
FIG. 13 is a plan view showing the schematic structure of a further cleaning apparatus in accordance with the present invention.

A further embodiment of the present invention will be described below. FIG. 13 is a plan view showing the schematic structure of a cleaning apparatus 1b. The cleaning apparatus 1b includes a foup loading/unloading part 2 capable of mounting six foups F in a line along the direction Y, two cleaning units 4a, 4b for cleaning the wafers W, a wafer transporting unit 3 for transporting the wafers W between the part 2 and the units 4a, 4b, a power unit 5 for various actuators and electronic controllers in the cleaning apparatus 1b, a chemical unit 6 for storing and supplying chemical liquids for cleaning the wafers W, and process control units 7a, 7b for controlling the cleaning operations at the cleaning units 4a, 4b independently of each other.

Similarly to the cleaning apparatus 1 described before, the process control units 7a, 7b are equipped with control devices 8b, 8c that perform the cleaning operations at the cleaning units 4a, 4b in compliance with designates recipes, respectively. In a space beneath the foup stages 2a to 2d, the control device 8a (not shown in FIG. 13) is arranged to operate various instruments, for example, the wafer transporting device 11, the wafer posture changing device 20a, etc. in compliance with designates recipes. In operation, the control device 8a and the control devices 8b, 8c mutually exchange control signals in order to perform the operation of the apparatus 1b smoothly.

Owing to the provision of two cleaning units 4a, 4b in the cleaning apparatus 1b, it is possible to increase the number of wafers W to be processed per unit time. Additionally, since the cleaning units 4a, 4b can be controlled independently of each other, it is also possible to perform the cleaning operations in compliance with different recipes in parallel. As the cleaning units 4a, 4b are respectively opened at each one side, it is possible for an operator to have easy access to the inside of the units 4a, 4b through each one side for the maintenance of the units 4a, 4b. It goes without describing that, in the cleaning apparatus 1b, the processing of the wafers W can be accomplished in compliance with a variety of methods afore-mentioned with reference to FIG. 8 etc.

Like the cleaning apparatus 1b, when the number of foups F that the foup loading/unloading part 2 can carry at a time is large, it is also desirable to provide the wafer transporting unit 3 with two wafer transporting devices 11. As a result, it is possible to elevate the throughput of the water transporting unit 3 in transporting the wafers W, thereby improving the throughput of the cleaning apparatus 1b as a whole.

Various embodiments of the present invention have been described in the above way. Nevertheless, the invention is not limited to these embodiments only. For instance, the number of foups F mounted on the foup loading/unloading part 2 of the cleaning apparatus may be suitably determined so as to improve the throughput of the cleaning apparatus, in consideration of access time of the automatic transporting device of foups and cleaning time of the cleaning apparatus (including both transporting time of the wafers W in the apparatus and processing time by chemicals). Assuming that the access time of the automatic transporting device of the foup F is fixed, if the cleaning time is relatively long, the number of foups F may be small. Conversely, if the cleaning time is short, it is desirable to increase the number of foups F.

Noted that the wafer posture changing devices 20a, 20b and the rotor 34 are capable of accommodating the wafers W at intervals of the half pitch in the above descriptions. In the modification, the holding pitch of the wafers W in the water posture changing devices 20a, 20b may be modified smaller than the normal pitch, for example, ⅓ of the normal pitch, ⅔ of the normal pitch, ¼ of the normal pitch, ¾ of the normal pitch, ⅝ of the normal pitch, etc.

Figure 14:
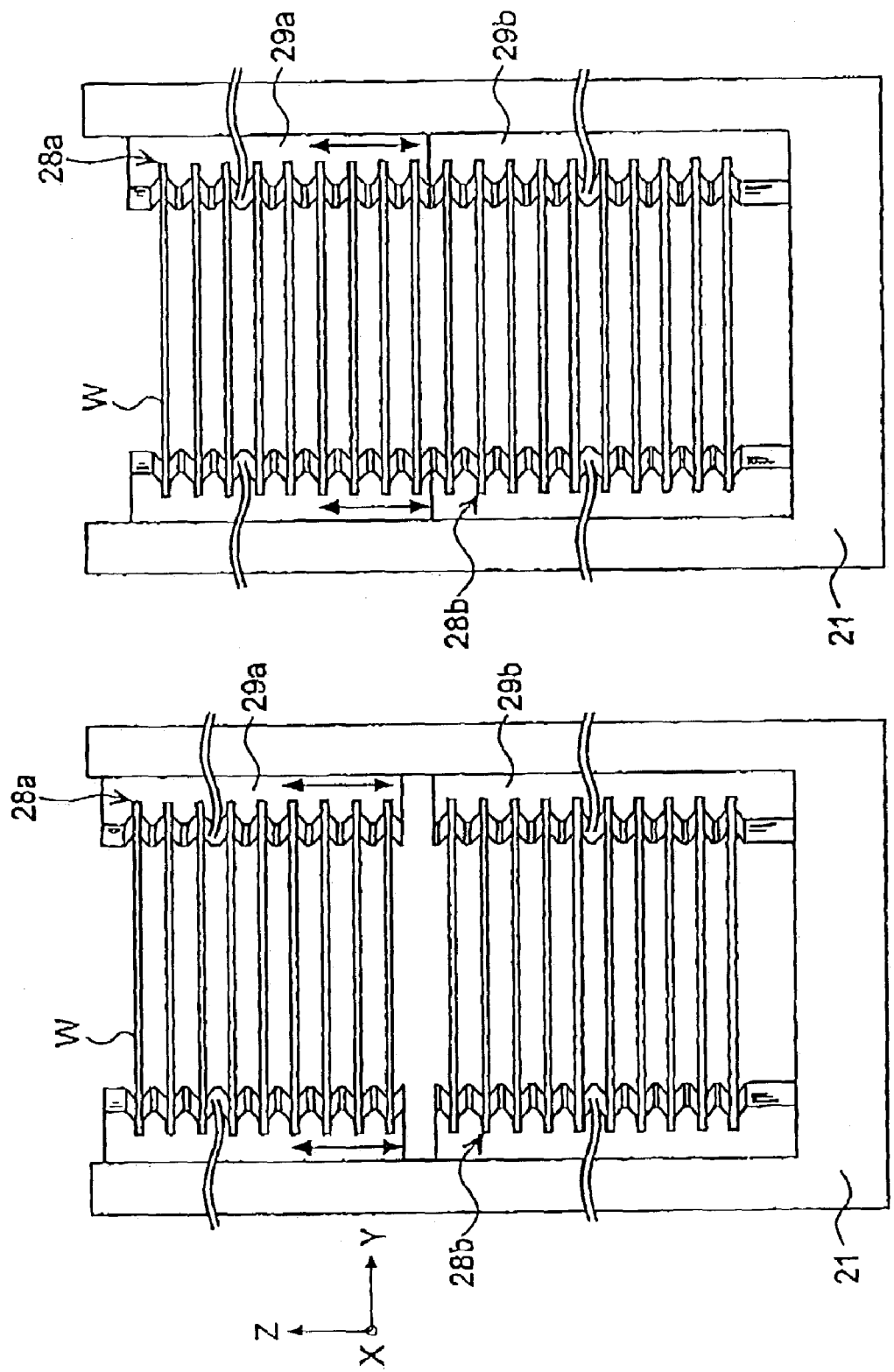
FIGS. 14A and 14B are side views showing the structure of another wafer holding arm provided in the wafer posture changing device.

In the modification, FIGS. 14A and 14B shows wafer holding members 29a, 29b in place of the above wafer holding members 22 in common with the wafer posture changing devices 20a, 20b. The wafer holding members 29b have retention grooves 28b formed at intervals of the half pitch and are fixed on the wafer holding arm 21. Similarly, the wafer holding members 29a have retention grooves 28a formed at intervals of the half pitch. Owing to the provision of a not-shown sliding mechanism, the wafer holding members 29a can move to and from the water holding members 29b.

FIG. 14A shows an arrangement that allows the wafers W to be transferred between the water holding members 29a, 29b and the wafer transporting picks 11a, 11b. In FIG. 14A, the lowermost wafer W in the wafer holding members 29a and the uppermost wafer W in the wafer holding members 29b face each other across a gap corresponding to the above-mentioned normal pitch. With the reservation of this gap, the wafer transporting picks 11a, 11b can have access to either ones of the wafer holding members 29a and the wafer holding members 29b optionally.

FIG. 14B shows another arrangement that allows the wafers W to be transferred between the wafer holding members 29a, 29b and the wafer gripping member 41. When the wafer holding members 29a come into contact with the wafer holding members 29b respectively, all the wafers W are accommodated in the wafer holding arm 21 at intervals of the half pitch. This arrangement allows all the wafers W to be accommodated in the rotor 34 at intervals of the half pitch and further supplied for the cleaning operations.

It is noted that the wafer holding members 22 of FIG. 4 define the fixed gap of the normal pitch between the first holding part 22a and the second holding part 22b. Consequently, there is the possibility that two wafers W facing each other across this gap are different from the other wafers W at intervals of the half pitch, in terms of cleaning condition about the wafer. On the other hand, according to the structure of FIG. 14B, since all the wafers W can be arranged at intervals of the half pitch due to the slidable wafer holding members 29a, it is possible to clean all the wafers W under the same cleaning condition. Thus, it is possible to prevent the occurrence of variation in quality of the cleaned wafers W.

In connection with the above modification, throughout the engagement members 38a and the holder 38b forming the rotor 34, it is desirable to form the retention grooves for holding the wafers W at intervals of the half pitch, in order to cope with both the wafer holding arm 21 of FIG. 4 and the wafer holding arm 21 of FIGS. 14A and 14B.

Figure 15:
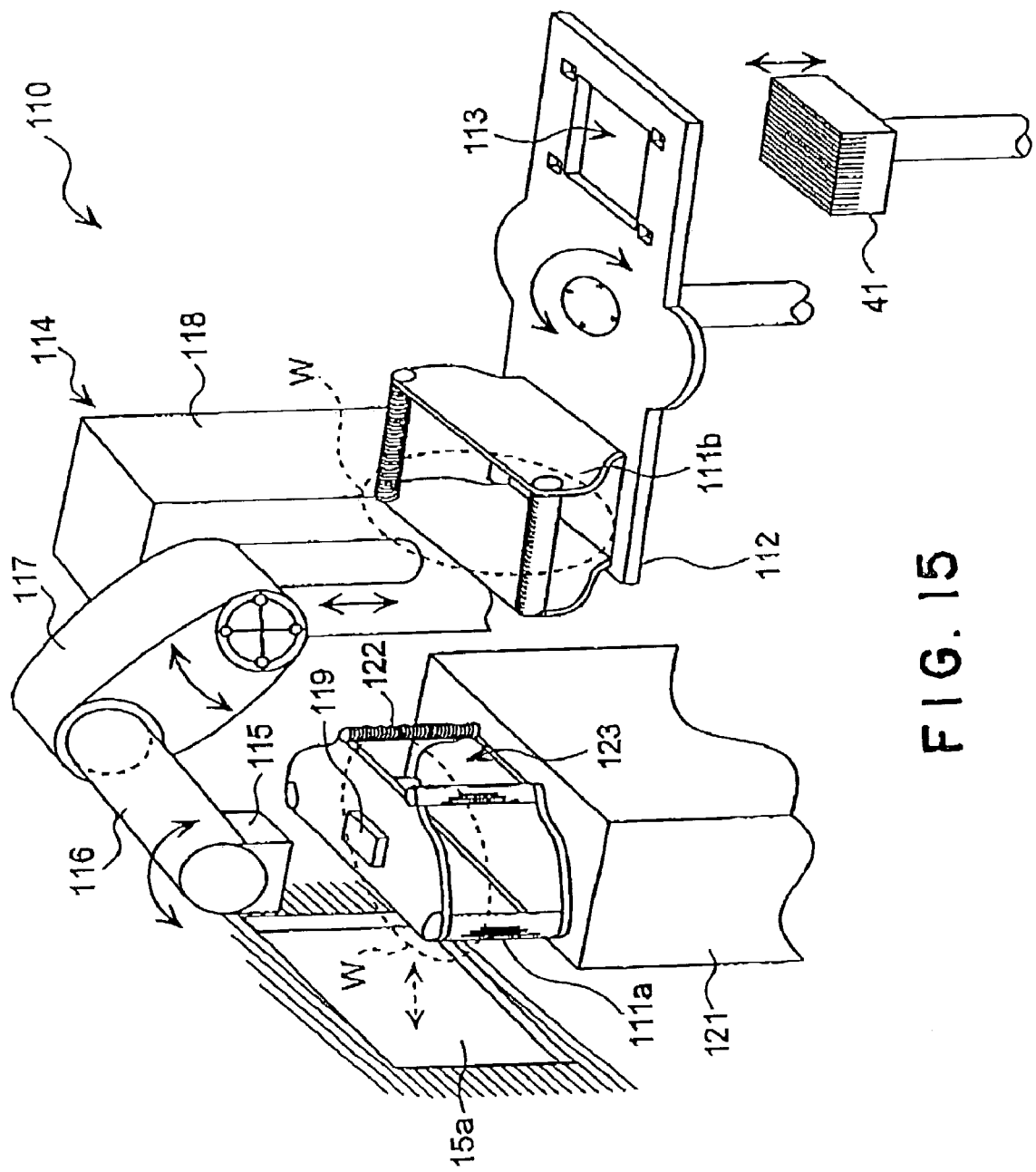
FIG. 15 is a perspective view showing the schematic structure of another wafer posture changing device provided in the cleaning apparatus.

As for the water posture changing device, the wafer posture changing devices 20a, 20b of the above-mentioned embodiments may be replaced with a wafer posture changing device 110 of FIG. 15.

The wafer posture changing device 110 includes a wafer transporting cassette 111a capable of accommodating fifty non-processed wafers W at intervals of the half pitch, a wafer transporting cassette 111b capable of accommodating fifty processed wafers W at intervals of the half pitch, a cassette mount plate 112 capable of mounting the cassettes 11a, 11b thereon, a cassette mounting table 121 for mounting the wafer transporting cassettes 111a, 111b so as to face the window 15a and a cassette transfer mechanism 114 for transporting the cassettes 111a, 111b between the cassette mounting table 121 and the cassette mount plate 112.

The wafer transporting cassette 111a is provided, therein, with retention grooves 122 similar to the retention grooves 28a, 28b of the wafer holding members 22, at intervals of the half pitch. On the side face of the wafer transporting cassette 111a, a chuck member 119 is formed to allow the cassette transfer mechanism 114 to carry the wafer transporting cassette 111a. Further, in order to allow the wafers W to be transferred between the wafer transporting cassette 111a and the wafer gripping member 41 while the cassette 111a is carrying the wafers W in their substantially-vertical postures, the cassette 111a is provided with a window 123. The wafer transporting cassette 111b has the same structure as that of the wafer transporting cassette 111a. Preferably, the wafer transporting cassettes 111a, 111b are made of resinous material, such as PEEK, PFDF, VP, etc.

The cassette mount plate 112 is rotatable by a not-shown rotating mechanism. The cassette mount plate 112 is provided, at its portions for mounting the wafer transporting cassettes 111a, 111b thereon, with windows 113 for passage of the wafer gripping member 41. The cassette transfer mechanism 114 includes a chuck 115 for attaching the chuck member 119, a first rotatable arm 116 having the check 115, a second rotatable arm 117 having the first rotatable arm 116 and a column member 118 having a built-in elevating mechanism (not shown) for carrying and elevating the second rotatable arm 117.

In the wafer posture changing device 110 constructed above, for example, the non-processed wafers W are carried in the wafer transporting cassette 111a through the window 15a at first. Next, the chuck 115 carries the chuck member 119 to pull up the wafer transporting cassette 111a from the cassette mounting table 121. While, the cassette mount plate 112 is rotated with an angle of 180 degrees so that an empty space for the wafer transporting cassette 111a is on the side of the window 15.

By rotating the first arm 116 with an angle of 90 degrees, the postures of the wafers W in the cassette 111a are changed to their substantially-vertical postures. Further, after rotating the second arm 117 with a predetermined angle, the wafer transporting cassette 111a is lowered to mount on a prescribed position on the plate 112. By rotating the cassette mount plate 112 with an angle of 180 degrees and further elevating the wafer gripping member 41, the wafers W can be transferred from the wafer transporting cassette 111a to the wafer gripping member 41. The transportation of the cleaned wafers W can be accomplished by using the wafer transporting cassette 111b, in the reverse order. processed The substrates to be supplied for the liquid processing, such as cleaning, are not limited to semiconductor wafers only. The present invention is applicable to a variety of liquid treatments, for example, process for cleaning glass substrates (e.g. LCD substrates), ceramic substrates, metallic substrates, etc.

As mentioned above, according to the present invention, it is possible to enhance the throughput of the apparatus since the substrates of two containers can be processed in one batch processing. Since the substrates are held by the substrate holder at intervals of a pitch smaller than the constant pitch at the container at liquid processing, there is no need of jumboizing the substrate holder etc. Additionally, it is also possible to perform the liquid processing while allowing the substrate holder to hold a plurality of substrates at intervals of an optional pitch. Therefore, against a situation that the processing liquid is hard to enter between the adjoining substrates because of its high viscosity, it is possible to cope with the above problem by increasing the pitch to hold the substrates. Furthermore, the composition of the substrates to be processed in one batch processing can be optionally altered by extracting prescribed ones of the substrates in the plural carriers. Consequently, if there are some substrates, which have to be processed with a specified processing liquid, over a plurality of carriers, it becomes possible to extract only the relevant substrates from the carriers and further possible to process the so-extracted substrates with the specified processing liquid in one try, thereby spreading the variation of liquid processing.

What is claimed is:

1. A liquid processing apparatus which supplies a plurality of substrates with a processing liquid while rotating the substrates to perform a liquid processing, comprising:
    a container mounting part for mounting a container where a plurality of substrates are accommodated at intervals of a constant pitch;
    a substrate holder capable of holding the plural substrates substantially parallel with each other at intervals of a pitch smaller than the constant pitch at the container;
    a substrate transporter for transporting the substrates between the container mounted on the container mounting part and the substrate holder;
    a rotor for rotating the substrate holder;
    a chamber formed so as to be able to accommodate the substrate holder therein;
    a processing-liquid supplier for supplying the substrates accommodated in the chamber with a processing liquid, and
    a substrate-posture changer that can hold the substrates of two containers at a time, substantially parallel with each other and at intervals of a pitch smaller than the constant pitch at the container and that can change the postures of the substrates between their substantially-horizontal postures and their substantially-vertical postures, wherein the substrate transporter comprises:
    a first substra(e transporting device that transfers the substrates one by one to and from the substrate-posture changer and the container mounted on the container mounting part, in a substantially-horizontal posture and that transports the substrates one by one between the container and the substrate-posture changer, in a substantially-horizontal posture; and a second substrate transporting device that transfers the substrates between the substrate-posture changer and the substrate holder, in their substantially-vertical postures, wherein the substrate holder can hold the plural substrates while maintaining the substrates being held in their substantially-vertical postures by the substrate-posture changer, and wherein the liquid processing is performed under condition that the substrates are held by the substrate holder at intervals of an optional pitch.

2. A liquid processing apparatus as claimed in claim 1, wherein the first substrate transporting device includes:

an unprocessed-wafer transporting pick that picks up an unprocessed substrate from the container mounted on the container mounting part and successively delivers the substrate to the substrate-posture changer; and a processed-wafer transporting pick that receives a processed substrate from the substrate-posture changer and successively puts the substrate back in a designated position of the container mounted on the container mounting part.

3. A liquid processing apparatus as claimed in claim 2, wherein the second substrate transporting device includes a third substrate holding arm having an unprocessed-substrate gripping part that receives the unprocessed substrates from the first substrate holding arm and successively delivers the substrates to the substrate holder and a processed-substrate gripping part that receives the processed substrates from the substrate holder first substrate holding arm and successively delivers the substrates to the second substrate holding arm.

4. A liquid processing apparatus as claimed in claim 1, wherein the substrate-posture changer comprises:

an unprocessed-wafer hold change mechanism including a first substrate holding arm having retention grooves formed at intervals of a pitch smaller than the constant pitch at the container to hold the substrates before the liquid processing, and a first arm rotating mechanism which rotates the first substrate holding arm so that the postures of the substrates held by the first substrate holding arm can be changed between their substantially-horizontal postures and their substantially-vertical postures; and a processed-wafer hold change mechanism including a second substrate holding arm having retention grooves formed at intervals of a pitch smaller than the constant pitch at the container to hold the substrates after the liquid processing, and a second arm rotating mechanism which rotates the second substrate holding arm so that the postures of the substrates held by the second substrate holding arm can be changed between their substantially-horizontal postures and their substantially-vertical postures.

5. A liquid processing apparatus as claimed in claim 4, wherein the unprocessed-wafer hold change mechanism further includes a first arm moving mechanism for moving the first substrate holding arm between one position to transfer the substrates from the first substrate holding arm to the first substrate transporting device, and vice versa and another position to transfer the substrates from the first substrate holding arm to the second substrate transporting device, and vice versa; and the processed-wafer hold change mechanism further includes a second arm moving mechanism for moving the second substrate holding arm between one position to transfer the substrates from the second substrate holding arm to the first substrate transporting device, and vice versa and another position to transfer the substrates from the second substrate holding arm to the second substrate transporting device, and vice versa.

6. A liquid processing apparatus as claimed in claim 4, wherein the first substrate holding arm and the second substrate holding arm each includes:

a first group of retention grooves formed at intervals of a pitch smaller than the constant pitch at the container, the number of the retention grooves being equal to the number of substrates that the single container can accommodate; and a second group of retention grooves formed at intervals of a pitch smaller than the constant pitch at the container, the number of the retention grooves being equal to the number of substrates that the single container can accommodate, wherein a pitch between the first group of retention grooves and the second group of retention grooves is equal to the constant pitch at the container.

7. A liquid processing apparatus as claimed in claim 4, wherein the first substrate holding arm and the second substrate holding arm each includes a guide for restraining movements of the substrates so that they do not protrude horizontally when changing the postures of substrates from their substantially-vertical postures to their substantially-horizontal postures.

8. A liquid processing apparatus as claimed in claim 1, further comprising a transportation control device that controls the operation of the first substrate transporting device in a manner that the first substrate transporting device picks up the substrates in designated number from the plural containers mounted on the container mounting part; subsequently delivers the substrates to the substrate-posture changer thereby forming one batch of substrates; and further returns each substrate after the liquid processing to an original slot in an original container where the substrate was, whereby the composition of the substrates supplied for one batch of liquid processing can be altered optionally.

9. A liquid processing apparatus which supplies a plurality of substrates with a processing liquid while rotating the substrates to perform a liquid processing, comprising:

a container mounting part for mounting a container where a plurality of substrates are accommodated at intervals of a constant pitch;

a substrate holder capable of holding the plural substrates substantially parallel with each other at intervals of a pitch smaller than the constant pitch at the container;

a substrate transporter for transporting the substrates between the container mounted on the container mounting part and the substrate holder;

a rotor for rotating the substrate holder;

a chamber formed so as to be able to accommodate the substrate holder therein; and processing-liquid supplier for supplying the substrates accommodated in the chamber with a processing liquid, wherein the liquid processing is performed under condition that the substrates are held by the substrate holder at intervals of an optional pitch and wherein the chamber includes an outer chamber which is in the form of a substantial cylinder capable of accommodating the substrate holder therein, the outer chamber having a window formed on one end face thereof to allow the substrate holder to enter and withdraw from the outer chamber, and an inner chamber which is slidable outside and inside the outer chamber and which is in the form of a substantial cylinder capable of accommodating the substrate holder while the inner cylinder is accommodated in the outer cylinder;

the inner chamber can enter and withdraw from the outer chamber through another end face thereof that does not include the window; and the liquid processing apparatus further comprises a holder moving mechanism for allowing the substrate holder to enter and withdraw from the outer chamber and a lid for closing the window when the substrate holder is accommodated in the outer chamber.

* * * * *